(12) United States Patent
Yoshizumi et al.

(10) Patent No.: US 11,421,344 B2
(45) Date of Patent: Aug. 23, 2022

(54) GALLIUM NITRIDE CRYSTAL SUBSTRATE

(71) Applicant: Sumitomo Electric Industries, Ltd., Osaka (JP)

(72) Inventors: Yusuke Yoshizumi, Kobe (JP); Hideki Osada, Kobe (JP); Shugo Minobe, Kobe (JP); Yoshiaki Hagi, Kobe (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 329 days.

(21) Appl. No.: 16/651,716

(22) PCT Filed: Feb. 23, 2018

(86) PCT No.: PCT/JP2018/006656
§ 371 (c)(1),
(2) Date: Mar. 27, 2020

(87) PCT Pub. No.: WO2019/163083
PCT Pub. Date: Aug. 29, 2019

(65) Prior Publication Data
US 2020/0255979 A1    Aug. 13, 2020

(51) Int. Cl.
*C30B 25/20* (2006.01)
*C30B 29/40* (2006.01)

(52) U.S. Cl.
CPC ........... *C30B 29/406* (2013.01); *C30B 25/20* (2013.01)

(58) Field of Classification Search
None
See application file for complete search history.

(56) References Cited

U.S. PATENT DOCUMENTS

2006/0226414 A1    10/2006 Oshima
2007/0105258 A1    5/2007 Yoshida
(Continued)

FOREIGN PATENT DOCUMENTS

JP    H09-309793 A    12/1997
JP    H11-162799 A    6/1999
(Continued)

OTHER PUBLICATIONS

Bockowski M. et al., "Challenges and future perspectives in HVPE-GaN growth on ammonothermal GaN seeds", Semiconductor Science Technology, IOP Publishing Ltd, GB, vol. 31, No. 9, Aug. 10, 2016, p. 93002 (25 pages).

*Primary Examiner* — Bradley Smith
(74) *Attorney, Agent, or Firm* — Faegre Drinker Biddle & Reath LLP

(57) ABSTRACT

A gallium nitride crystal substrate has a diameter of 50-155 mm and a thickness of 300-800 μm and includes any of a flat portion and a notch portion in a part of an outer edge. The gallium nitride crystal substrate contains any of oxygen atoms, silicon atoms, and carriers at a concentration of $2 \times 10^{17}$ to $4 \times 10^{18}$ cm$^{-3}$, and has an average dislocation density of 1000 to $5 \times 10^7$ cm$^{-2}$ in any of a first flat region extending over a width from the flat portion to a position at a distance of 2 mm in a direction perpendicular to a straight line indicating the flat portion in a main surface and a first notch region extending over a width from the notch portion to a position at a distance of 2 mm in a direction perpendicular to a curve indicating the notch portion in the main surface.

6 Claims, 7 Drawing Sheets

(56) References Cited

U.S. PATENT DOCUMENTS

2019/0119112 A1\* 4/2019 Yoshida ................. C23C 16/34
2021/0384336 A1\* 12/2021 Enatsu .............. H01L 21/02433

FOREIGN PATENT DOCUMENTS

| JP | 2002-356398 A | 12/2002 |
| JP | 2007-134461 A | 5/2007 |
| JP | 2009-105435 A | 5/2009 |
| JP | 2015-140270 A | 8/2015 |

\* cited by examiner (A)

(B)

(C)

GALLIUM NITRIDE CRYSTAL SUBSTRATE

TECHNICAL FIELD

The present invention relates to a gallium nitride crystal substrate.

BACKGROUND ART

Japanese Patent Laying-Open No. 2002-356398 (PTL 1) discloses as an annular wafer composed of gallium nitride crystal, a transparent and independent annular gallium nitride wafer composed of hexagonal gallium nitride single crystal having a {0001} plane orientation, characterized in having an outer circumferential portion beveled at an inclination angle from 5° to 30° on a front surface side and a rear surface side. Japanese Patent Laying-Open No. 2009-105435 (PTL 2) discloses a transparent and independent annular gallium nitride wafer composed of hexagonal gallium nitride single crystal having a {0001} plane orientation, characterized in including a flat portion for exhibiting a specific crystal orientation {hkm0} orthogonal to a plane obtained by cutting an arcuate portion in a part of an outer circumferential portion. Japanese Patent Laying-Open No. 2007-134461 (PTL 3) discloses a group III nitride semiconductor substrate chamfered on both sides of a group III polar surface and a nitrogen polar surface of a circular arc portion of the substrate, characterized in that a chamfered portion on the side of the nitrogen polar surface is chamfered at an angle exceeding 30° and not greater than 60° over the entire periphery including an orientation flat portion of the substrate.

CITATION LIST

Patent Literature

PTL 1: Japanese Patent Laying-Open No. 2002-356398
PTL 2: Japanese Patent Laying-Open No. 2009-105435
PTL 3: Japanese Patent Laying-Open No. 2007-134461

SUMMARY OF INVENTION

A gallium nitride crystal substrate according to one manner of the present invention includes a main surface having a diameter not smaller than 50 mm and not greater than 155 mm and a thickness not smaller than 300 μm and not greater than 800 μm. A part of an outer edge of the gallium nitride crystal substrate includes any of a flat portion and a notch portion. The gallium nitride crystal substrate contains any of oxygen atoms, silicon atoms, and carriers at a concentration not lower than $2\times10^{17}$ $cm^{-3}$ and not higher than $4\times10^{18}$ $cm^{-3}$. The gallium nitride crystal substrate has an average dislocation density not lower than 1000 $cm^{-2}$ and not higher than $5\times10^{7}$ $cm^{-2}$ in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface.

A gallium nitride crystal substrate according to one manner of the present invention includes a main surface having a diameter not smaller than 50 mm and not greater than 155 mm and a thickness not smaller than 300 μm and not greater than 800 μm. A part of an outer edge of the gallium nitride crystal substrate includes any of a flat portion and a notch portion. The gallium nitride crystal substrate contains any of oxygen atoms, silicon atoms, and carriers at a concentration not lower than $2\times10^{17}$ $cm^{-3}$ and not higher than $4\times10^{18}$ $cm^{-3}$. The gallium nitride crystal substrate has average residual stress not lower than −10 MPa and not higher than 10 MPa in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface.

A gallium nitride crystal substrate according to one manner of the present invention includes a main surface having a diameter not smaller than 50 mm and not greater than 155 mm and a thickness not smaller than 300 μm and not greater than 800 μm. A part of an outer edge of the gallium nitride crystal substrate includes any of a flat portion and a notch portion. The gallium nitride crystal substrate contains any of oxygen atoms, silicon atoms, and carriers at a concentration not lower than $2\times10^{17}$ $cm^{-3}$ and not higher than $4\times10^{18}$ $cm^{-3}$. The gallium nitride crystal substrate has an average dislocation density not lower than 1000 $cm^{-2}$ and not higher than $5\times10^{7}$ $cm^{-2}$ in any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface.

A gallium nitride crystal substrate according to one manner of the present invention includes a main surface having a diameter not smaller than 50 mm and not greater than 155 mm and a thickness not smaller than 300 μm and not greater than 800 μm. A part of an outer edge of the gallium nitride crystal substrate includes any of a flat portion and a notch portion. The gallium nitride crystal substrate contains any of oxygen atoms, silicon atoms, and carriers at a concentration not lower than $2\times10^{17}$ $cm^{-3}$ and not higher than $4\times10^{18}$ $cm^{-3}$. The gallium nitride crystal substrate has average residual stress not lower than −10 MPa and not higher than 10 MPa in any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface.

DETAILED DESCRIPTION

Figure 1A:
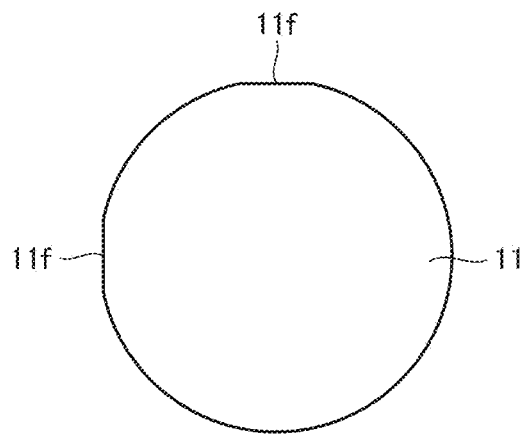
FIG. 1A is a schematic plan view showing an exemplary location of a part of an outer edge where a flat portion is formed, in a gallium nitride crystal substrate according to one manner of the present invention.

Problem to be Solved by the Present Disclosure

Gallium nitride wafers disclosed in Japanese Patent Laying-Open No. 2002-356398 (PTL 1) and Japanese Patent Laying-Open No. 2009-105435 (PTL 2) as well as a group III nitride semiconductor substrate disclosed in Japanese Patent Laying-Open No. 2007-134461 (PTL 3) are disadvantageously high in ratio of defects due to cracking (a crack defect ratio) in a flat portion and the vicinity thereof or a notch portion and the vicinity thereof in manufacturing of a substrate including any of the flat portion and the notch portion in a part of an outer edge (in manufacturing of a substrate with flat portion/notch portion) and/or in growth of an epitaxial layer on the substrate including any of the flat portion and the notch portion in a part of the outer edge (in growth of an epitaxial layer on a substrate with flat portion/ notch portion).

Though Japanese Patent Laying-Open No. 2002-356398 (PTL 1), Japanese Patent Laying-Open No. 2009-105435 (PTL 2), and Japanese Patent Laying-Open No. 2007-134461 (PTL 3) have discussed a shape of beveling of a wafer or a substrate, they have not discussed an average dislocation density or average residual stress in the flat portion and the vicinity thereof or the notch portion and the vicinity thereof in the wafer or the substrate.

Therefore, an object is to provide a gallium nitride crystal substrate low in ratio of defects due to cracking (crack defect ratio) in a flat portion and the vicinity thereof or a notch portion and the vicinity thereof in manufacturing of a substrate with flat portion/notch portion and in growth of an epitaxial layer on the substrate with flat portion/notch portion.

Advantageous Effect of the Present Disclosure

According to the present disclosure, a gallium nitride crystal substrate low in ratio of defects due to cracking (crack defect ratio) in a flat portion and the vicinity thereof or a notch portion and the vicinity thereof in manufacturing of a substrate with flat portion/notch portion and in growth of an epitaxial layer on the substrate with flat portion/notch portion can be provided. The flat portion and the vicinity thereof means first and second flat regions and the notch portion and the vicinity thereof means first and second notch regions.

Description of Embodiments of the Present Invention

Embodiments of the present invention will initially be listed and described. In order to clearly distinguish among a plurality of flat regions and notch regions, denotations as a first flat region and a first notch region or a second flat region and a second notch region are given.

[1] A gallium nitride (GaN) crystal substrate according to one manner of the present invention includes a main surface having a diameter not smaller than 50 mm and not greater than 155 mm and a thickness not smaller than 300 μm and not greater than 800 μm. A part of an outer edge of the GaN crystal substrate includes any of a flat portion and a notch portion. The GaN crystal substrate contains any of oxygen (O) atoms, silicon (Si) atoms, and carriers at a concentration not lower than $2 \times 10^{17}$ cm$^{-3}$ and not higher than $4 \times 10^{18}$ cm$^{-3}$. The GaN crystal substrate has an average dislocation density not lower than 1000 cm$^{-2}$ and not higher than $5 \times 10^7$ cm$^{-2}$ in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface. Since the GaN crystal substrate in the present manner has an average dislocation density within a prescribed range in any of the first flat region and the first notch region, it is low in crack defect ratio in manufacturing of the substrate and in growth of an epitaxial layer on the substrate.

[2] A GaN crystal substrate according to one manner of the present invention includes a main surface having a diameter not smaller than 50 mm and not greater than 155 mm and a thickness not smaller than 300 μm and not greater than 800 μm. A part of an outer edge of the GaN crystal substrate includes any of a flat portion and a notch portion. The GaN crystal substrate contains any of O atoms, Si atoms, and carriers at a concentration not lower than $2\times10^{17}$ $cm^{-3}$ and not higher than $4\times10^{18}$ $cm^{-3}$. The GaN crystal substrate has average residual stress not lower than −10 MPa and not higher than 10 MPa in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface. Regarding a value of average residual stress, a negative value represents tensile stress and a positive value represents compressive stress. Since the GaN crystal substrate in the present manner has average residual stress within a prescribed range in any of the first flat region and the first notch region, it is low in crack defect ratio in manufacturing of the substrate and in growth of an epitaxial layer on the substrate.

[3] A GaN crystal substrate according to one manner of the present invention includes a main surface having a diameter not smaller than 50 mm and not greater than 155 mm and a thickness not smaller than 300 μm and not greater than 800 Gm. A part of an outer edge of the GaN crystal substrate includes any of a flat portion and a notch portion. The GaN crystal substrate contains any of O atoms, Si atoms, and carriers at a concentration not lower than $2\times10^{17}$ $cm^{-3}$ and not higher than $4\times10^{18}$ $cm^{-3}$. The GaN crystal substrate can have an average dislocation density not lower than 1000 $cm^{-2}$ and not higher than $5\times10^{7}$ $cm^{-2}$ and average residual stress not lower than −10 MPa and not higher than 10 MPa in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface. Regarding a value of average residual stress, a negative value represents tensile stress and a positive value represents compressive stress. Since the GaN crystal substrate in the present manner has an average dislocation density and average residual stress each within a prescribed range in any of the first flat region and the first notch region, it is lower in crack defect ratio in manufacturing of the substrate and in growth of an epitaxial layer on the substrate.

[4] A GaN crystal substrate according to one manner of the present invention includes a main surface having a diameter not smaller than 50 mm and not greater than 155 mm and a thickness not smaller than 300 μm and not greater than 800 μm. A part of an outer edge of the GaN crystal substrate includes any of a flat portion and a notch portion. The GaN crystal substrate contains any of O atoms, Si atoms, and carriers at a concentration not lower than $2\times10^{17}$ $cm^{-3}$ and not higher than $4\times10^{18}$ $cm^{-3}$. The GaN crystal substrate has an average dislocation density not lower than 1000 $cm^{-2}$ and not higher than $5\times10^{7}$ $cm^{-2}$ in any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface. Since the GaN crystal substrate in the present manner has an average dislocation density within a prescribed range in any of the second flat region and the second notch region and can control the average dislocation density in a partial region located in the vicinity of an outer circumferential portion of any of the first flat region and the first notch region to be within a certain range, the GaN crystal substrate is low in crack defect ratio in manufacturing of the substrate and in growth of an epitaxial layer on the substrate.

[5] A GaN crystal substrate according to one manner of the present invention includes a main surface having a diameter not smaller than 50 mm and not greater than 155 mm and a thickness not smaller than 300 μm and not greater than 800 μm. A part of an outer edge of the GaN crystal substrate includes any of a flat portion and a notch portion. The GaN crystal substrate contains any of O atoms, Si atoms, and carriers at a concentration not lower than $2\times10^{17}$ $cm^{-3}$ and not higher than $4\times10^{18}$ $cm^{-3}$. The GaN crystal substrate has average residual stress not lower than −10 MPa and not higher than 10 MPa in any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface. Regarding a value of average residual stress, a negative value represents tensile stress and a positive value represents compressive stress. Since the GaN crystal substrate in the present manner has average residual stress within a prescribed range in any of the second flat region and the second notch region and can control the average residual stress in a partial region located in the vicinity of an outer circumferential portion of any of the first flat region and the first notch region to be within a certain range, the GaN crystal substrate is low in crack defect ratio in manufacturing of the substrate and in growth of an epitaxial layer on the substrate.

[6] A GaN crystal substrate according to one manner of the present invention includes a main surface having a diameter not smaller than 50 mm and not greater than 155 mm and a thickness not smaller than 300 μm and not greater than 800 μm. A part of an outer edge of the GaN crystal substrate includes any of a flat portion and a notch portion. The GaN crystal substrate contains any of O atoms, Si atoms, and carriers at a concentration not lower than $2\times10^{17}$ $cm^{-3}$ and not higher than $4\times10^{18}$ $cm^{-3}$. The GaN crystal substrate can have an average dislocation density not lower than 1000 $cm^{-2}$ and not higher than $5\times10^{7}$ $cm^{-2}$ and average residual stress not lower than −10 MPa and not higher than 10 MPa in any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface. Regarding a value of average residual stress, a negative value represents tensile stress and a positive value represents compressive stress. Since the GaN crystal substrate in the present manner has an average dislocation density and average residual stress each within a prescribed range in any of the second flat region and the second notch region, it is lower in crack defect ratio in manufacturing of the substrate and in growth of an epitaxial layer on the substrate.

Details of Embodiments of the Present Invention

<GaN Crystal Substrate>

Figure 1B:
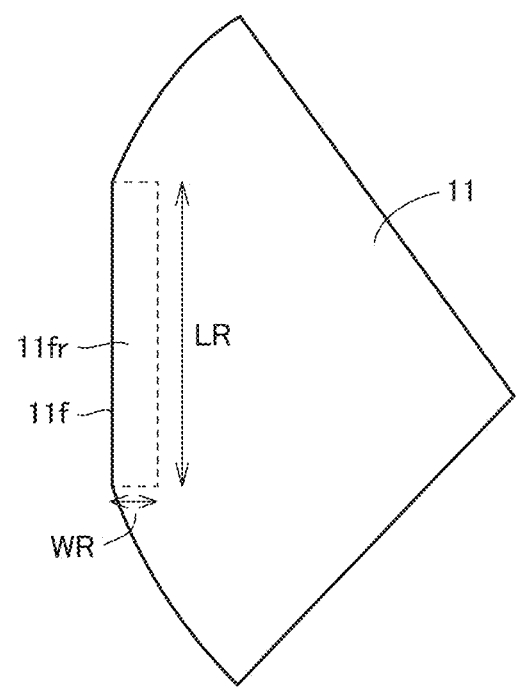
FIG. 1B is an enlarged schematic plan view showing an exemplary flat portion and first and second flat regions in the gallium nitride crystal substrate according to one manner of the present invention.

FIGS. 1A, 1B, 2A, and 2B show an exemplary GaN crystal substrate 11 in the present embodiment. FIG. 1A is a schematic plan view showing a location of a part of an outer edge of GaN crystal substrate 11 where a flat portion 11f is formed. FIG. 1B is an enlarged schematic plan view showing flat portion 11f and first and second flat regions 11fr. Flat portion 11f refers to a flat surface formed in a part of an outer edge (outer circumference) of a crystalline body and a crystal substrate for facilitating determination of a crystal orientation of the crystalline body and the crystal substrate, distinction between the front and the rear, and registration in a process. In GaN crystal substrate 11 with flat portion, at least one flat portion 11f is formed and normally two flat portions are formed, which are also called orientation flat (which is also referred to as OF below) and identification flat (which is also referred to as IF below). In GaN crystal substrate 11, a plane orientation of a main surface, an off direction, an off angle, and a position of the flat portion (OF/IF) are set as desired by a client. For example, the plane orientation of the main surface is set as (0001), twelve off directions are set, an off angle is set to be not smaller than 0° and not greater than 20°, OF/IF positions are set as two types of a clockwise position (which is also referred to as CW below, IF being arranged at a clockwise position with respect to OF) and a counterclockwise position (which is also referred to as CCW below, IF being arranged at a counterclockwise position with respect to OF), an OF length is set to be not shorter than 10 mm and not longer than 65 mm, and an IF length is set to be not shorter than 4 mm and not longer than 45 mm.

Figure 2A:
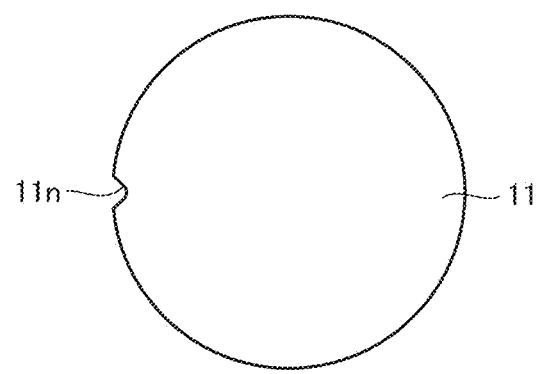
FIG. 2A is a schematic plan view showing an exemplary location of a part of an outer edge where a notch portion is provided, in a gallium nitride crystal substrate according to one manner of the present invention.
Figure 2B:
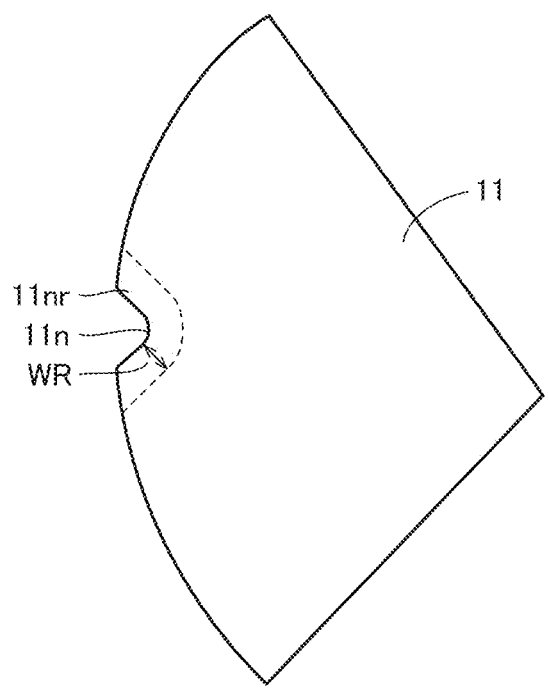
FIG. 2B is an enlarged schematic plan view showing the notch portion and first and second notch regions in the gallium nitride crystal substrate according to one manner of the present invention.

FIG. 2A is a schematic plan view showing a location of a part of the outer edge of GaN crystal substrate 11 where a notch portion 11n is provided. FIG. 2B is an enlarged schematic plan view showing notch portion 11n and first and second notch regions 11nr. Notch portion 11n refers to a cut portion provided in a part of the outer edge (outer circumference) of a crystalline body and a crystal substrate for facilitating determination and alignment of a crystal orientation of the crystalline body and the crystal substrate. In GaN crystal substrate 11 with notch portion, at least one notch portion 11n is provided and normally one notch portion is provided. In GaN crystal substrate 11, a plane orientation of a main surface, a shape of the notch, and a direction of a central cut of the notch are set as desired by a client. For example, the plane orientation of the main surface is set as (0001), a notch is shaped by cutting off a portion not smaller than 0.5 mm and not greater than 1.5 mm from the outer edge toward the center at an opening angle not smaller than 85° and not greater than 95°, and a direction of the central cut of the notch is set to a direction of an m axis ([1-100]) when viewed from the center.

Embodiment I-1

Referring to FIGS. 1A, 1B, 2A, and 2B, GaN crystal substrate 11 in the present embodiment includes a main surface having a diameter not smaller than 50 mm and not greater than 155 mm and a thickness not smaller than 300 μm and not greater than 800 μm. A part of an outer edge of GaN crystal substrate 11 includes any of flat portion 11f and notch portion 11n. GaN crystal substrate 11 contains any of O atoms, Si atoms, and carriers at a concentration not lower than $2 \times 10^{17}$ cm$^{-3}$ and not higher than $4 \times 10^{18}$ cm$^{-3}$. GaN crystal substrate 11 has an average dislocation density not lower than 1000 cm$^{-2}$ and not higher than $5 \times 10^{7}$ cm$^{-2}$ in any of first flat region 11fr extending over a width WR from flat portion 11f to a position at a distance of 2 mm in a direction perpendicular to a straight line indicating flat portion 11f in the main surface and first notch region 11nr extending over width WR from notch portion 11n to a position at a distance of 2 mm in a direction perpendicular to a curve indicating notch portion 11n in the main surface. Since GaN crystal substrate 11 in the present embodiment has an average dislocation density within a prescribed range in any of first flat region 11fr and first notch region 11nr, it is low in crack defect ratio in manufacturing of the substrate and in growth of an epitaxial layer on the substrate.

"Being perpendicular to a curve indicating the notch portion in the main surface" in the GaN crystal substrate in the present embodiment means being perpendicular to a tangential line at each point on the curve indicating the notch portion in the main surface. The "curve" here means a line not being straight at least in part and may include a straight line in part. The crack defect ratio is varied by a diameter of the GaN crystal substrate, a type (O atoms or Si atoms) of contained atoms or carriers or a concentration thereof, or a difference in manufacturing of a substrate or growth of an epitaxial layer, and being low in crack defect ratio means a relatively low crack defect ratio so long as a diameter of the GaN crystal substrate, a type (O atoms or Si atoms) of contained atoms and carriers and a concentration thereof, and manufacturing of the substrate or growth of an epitaxial layer are identical.

GaN crystal substrate 11 in the present embodiment has a diameter not smaller than 50 mm and not greater than 155 mm and a thickness not smaller than 300 μm and not greater than 800 μm. From a point of view of lowering in crack defect ratio also in GaN crystal substrate 11 large in diameter, GaN crystal substrate 11 has a diameter not smaller than 50 mm and not greater than 155 mm. From a point of view of lowering in crack defect ratio, GaN crystal substrate 11 has a thickness not smaller than 300 μm and not greater than 800 μm.

A part of the outer edge of GaN crystal substrate 11 in the present embodiment includes any of flat portion 11f (FIGS. 1A and 1B) and notch portion 11n (FIGS. 2A and 2B). By suppressing crack in flat portion 11f and the vicinity thereof or also in notch portion 11n and the vicinity thereof in GaN crystal substrate 11, the crack defect ratio can be lowered.

GaN crystal substrate 11 contains any of O atoms, Si atoms, and carriers at a concentration not lower than $2 \times 10^{17}$ cm$^{-3}$ and not higher than $4 \times 10^{18}$ cm$^{-3}$. A concentration of O atoms and Si atoms is measured by secondary ion mass spectrometry (SIMS). A concentration of carriers is measured by Hall measurement. Since an average dislocation density in GaN crystal substrate 11 is varied by a concentration of contained O atoms, Si atoms, and carriers, the crack defect ratio can be lowered by adjusting, at a prescribed concentration of O atoms, Si atoms, or carriers, the average dislocation density in any of the first flat region and the first notch region to be within a prescribed range.

GaN crystal substrate 11 is provided with N-type conductivity with increase in concentration of contained O atoms. GaN crystal substrate 11 is provided with N-type conductivity with increase in concentration of contained Si atoms. GaN crystal substrate 11 is provided with N-type conductivity with increase in concentration of contained carriers.

From a point of view of lowering in crack defect ratio of GaN crystal substrate 11 in the present embodiment in manufacturing of the substrate and in growth of an epitaxial layer on the substrate, the GaN crystal substrate has an average dislocation density not lower than 1000 cm$^{-2}$ and not higher than 5×10$^7$ cm$^{-2}$ in any of first flat region 11$fr$ extending over width WR from flat portion 11$f$ to a position at a distance of 2 mm in the direction perpendicular to the straight line indicating flat portion 11$f$ in the main surface and first notch region 11$nr$ extending over width WR from notch portion 11$n$ to a position at a distance of 2 mm in the direction perpendicular to the curve indicating notch portion 11$n$ in the main surface.

From a point of view of further lowering in crack defect ratio of GaN crystal substrate 11 in the present embodiment in manufacturing of the substrate and in growth of an epitaxial layer on the substrate, the GaN crystal substrate preferably has an average dislocation density not lower than 1000 cm$^{-2}$ and not higher than 5×10$^7$ cm$^{-2}$ in any of second flat region 11$fr$ extending over width WR from flat portion 11$f$ to a position at a distance of 1 mm in the direction perpendicular to the straight line indicating flat portion 11$f$ in the main surface and second notch region 11$nr$ extending over width WR from notch portion 11$n$ to the position at a distance of 1 mm in the direction perpendicular to the curve indicating notch portion 11$n$ in the main surface.

The second flat region and the second notch region are partial regions closer to flat portion 11$f$ and notch portion 11$n$ in the first flat region and the first notch region, respectively. The second flat region and the second notch region which are parts of the first flat region and the first notch region on a side of the outer circumferential portion may be higher in average dislocation density than the first flat region and the first notch region, respectively. Since crack originates from the outer circumferential portion, a value of the average dislocation density in the second flat region more affects the crack defect ratio. Therefore, the GaN crystal substrate having the average dislocation density within the range above also in the second flat region and the second notch region which may be high in average dislocation density is lower in crack defect ratio in manufacturing of the substrate and in growth of an epitaxial layer on the substrate.

Figure 3A:
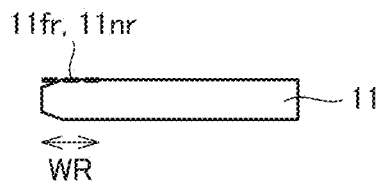
FIG. 3A is an enlarged schematic cross-sectional view showing an exemplary portion of measurement of an average dislocation density in the gallium nitride crystal substrate according to one manner of the present invention.
Figure 3B:
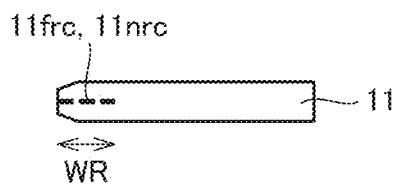
FIG. 3B is an enlarged schematic cross-sectional view showing another exemplary portion of measurement of an average dislocation density in the gallium nitride crystal substrate according to one manner of the present invention.

FIGS. 3A and 3B are enlarged schematic cross-sectional views showing an exemplary portion of measurement of an average dislocation density in GaN crystal substrate 11 in the present embodiment. Referring to FIG. 3A, an average dislocation density in GaN crystal substrate 11 is measured by using a microscope, as an average per unit area of etch pits (etch pit average density) produced in the main surface in first or second flat region 11$fr$ or first or second notch region 11$nr$ after immersion of GaN crystal substrate 11 for sixty minutes in a potassium hydroxide (KOH) melt at 500° C. Etch pits, however, may not be visible in a beveled portion of the flat portion in first or second flat region 11$fr$ or a beveled portion of the notch portion in first or second notch region 11$nr$. In this case, referring to FIG. 3B, an average density of etch pits produced by performing treatment under conditions the same as above onto a first or second flat region 11$frc$ in a central portion or a first or second notch region 11$nrc$ in a central portion exposed by grinding the main surface in first or second flat region 11$fr$ or first or second notch region 11$nr$ toward the central portion of the substrate is measured.

Though a length LR of flat portion 11$f$ is not particularly restricted, from a point of view of enhanced visibility as well as securing a region from which a chip is taken, an OF length not shorter than 10 mm and not longer than 65 mm and an IF length not shorter than 4 mm and not longer than 45 mm are preferred.

A GaN crystal substrate having a diameter of two inches more preferably has an OF length not shorter than 10 mm and not longer than 20 mm and an IF length not shorter than 4 mm and not longer than 10 mm. A GaN crystal substrate having a diameter of four inches more preferably has an OF length not shorter than 20 mm and not longer than 40 mm and an IF length not shorter than 10 mm and not longer than 25 mm. A GaN crystal substrate having a diameter of six inches more preferably has an OF length not shorter than 43 mm and not longer than 65 mm and an IF length not shorter than 25 mm and not longer than 45 mm.

From a point of view of enhanced visibility and machine recognizability as well as securing a region from which a chip is taken, a notch in notch portion 11$n$ is shaped preferably by cutting off a portion having a size not smaller than 0.5 mm and not greater than 1.5 mm from the outer edge toward the center at an opening angle not smaller than 85° and not greater than 95° and more preferably by cutting off a portion having a size not smaller than 1.00 mm and not greater than 1.25 mm from the outer edge toward the center at an opening angle not smaller than 89° and not greater than 950, and the direction of the central cut of the notch is preferably set to the direction of the M axis ([1-100]) when viewed from the center.

Embodiment I-2

Referring to FIGS. 1A, 1B, 2A, and 2B, GaN crystal substrate 11 in the present embodiment includes a main surface having a diameter not smaller than 50 mm and not greater than 155 mm and a thickness not smaller than 300 μm and not greater than 800 μm. A part of the outer edge of GaN crystal substrate 11 includes any of flat portion 11$f$ and notch portion 11$n$. GaN crystal substrate 11 contains any of O atoms, Si atoms, and carriers at a concentration not lower than 2×10$^{17}$ cm$^{-3}$ and not higher than 4×10$^{18}$ cm$^{-3}$. GaN crystal substrate 11 has average residual stress not lower than −10 MPa and not higher than 10 MPa in any of first flat region 11$fr$ extending over width WR from flat portion 11$f$ to a position at a distance of 2 mm in the direction perpendicular to the straight line indicating flat portion 11$f$ in the main surface and first notch region 11$nr$ extending over width WR from notch portion 11$n$ to a position at a distance of 2 mm in the direction perpendicular to the curve indicating notch portion 11$n$ in the main surface. Regarding a value of average residual stress, a negative value represents tensile stress and a positive value represents compressive stress. Since the GaN crystal substrate in the present embodiment has average residual stress within a prescribed range in any of the first flat region and the first notch region, it is low in crack defect ratio in manufacturing of the substrate and in growth of an epitaxial layer on the substrate.

"Being perpendicular to the curve indicating the notch portion in the main surface" in the GaN crystal substrate in the present embodiment means being perpendicular to a tangential line at each point on the curve indicating the notch portion in the main surface. The "curve" here means a line not being straight at least in part and may include a straight line in part. The crack defect ratio is varied by a diameter of the GaN crystal substrate, a type (O atoms or Si atoms) of contained atoms or carriers or a concentration thereof, or a difference in manufacturing of a substrate or growth of an epitaxial layer, and being low in crack defect ratio means a relatively low crack defect ratio so long as a diameter of the GaN crystal substrate, a type (O atoms or Si atoms) of contained atoms and carriers and a concentration thereof, and manufacturing of the substrate or growth of an epitaxial layer are identical.

Since the diameter not smaller than 50 mm and not greater than 155 mm, the thickness not smaller than 300 µm and not greater than 800 µm, and the concentration of O atoms, Si atoms, and carriers not lower than $2\times10^{17}$ cm$^{-3}$ and not higher than $4\times10^{18}$ cm$^{-3}$, of GaN crystal substrate 11 in the present embodiment are the same as the diameter not smaller than 50 mm and not greater than 155 mm, the thickness not smaller than 300 µm and not greater than 800 µm, and the concentration of O atoms, Si atoms, and carriers not lower than $2\times10^{17}$ cm$^{-3}$ and not higher than $4\times10^{18}$ cm$^{-3}$, of GaN crystal substrate 11 in Embodiment I-1, respectively, description will not be repeated. Since average residual stress in any of the first flat region and the first notch region of GaN crystal substrate 11 is varied by a concentration of contained O atoms, Si atoms, and carriers, the crack defect ratio can be lowered by adjusting, at a prescribed concentration of O atoms, Si atoms, and carriers, average residual stress in any of the first flat region and the first notch region to be within a prescribed range.

From a point of view of lowering in crack defect ratio in manufacturing of the substrate and in growth of an epitaxial layer on the substrate, GaN crystal substrate 11 in the present embodiment has average residual stress not lower than −10 MPa and not higher than 10 MPa in any of first flat region 11fr extending over width WR from flat portion 11f to a position at a distance of 2 mm in the direction perpendicular to the straight line indicating flat portion 11f in the main surface and first notch region 11nr extending over width WR from notch portion 11n to a position at a distance of 2 mm in the direction perpendicular to the curve indicating notch portion 11n in the main surface.

From a point of view of further lowering in crack defect ratio in manufacturing of the substrate and in growth of an epitaxial layer on the substrate, GaN crystal substrate 11 in the present embodiment preferably has average residual stress not lower than −10 MPa and not higher than 10 MPa in any of second flat region 11fr extending over width WR from flat portion 11f to a position at a distance of 1 mm in the direction perpendicular to the straight line indicating flat portion 11f in the main surface and second notch region 11nr extending over width WR from notch portion 11n to a position at a distance of 1 mm in the direction perpendicular to the curve indicating notch portion 11n in the main surface.

The second flat region and the second notch region are partial regions closer to flat portion 11f and notch portion 11n in the first flat region and the first notch region, respectively. The second flat region and the second notch region which are parts of the first flat region and the first notch region on the outer circumferential side may be greater in absolute value of average residual stress than the first flat region and the first notch region, respectively. Since crack originates from the outer circumferential portion, a value of average residual stress in the second flat region more affects the crack defect ratio. Therefore, the GaN crystal substrate having the average residual stress within the range above also in the second flat region and the second notch region which may be great in absolute value of average residual stress is lower in crack defect ratio in manufacturing of the substrate and in growth of an epitaxial layer on the substrate.

Figure 4:
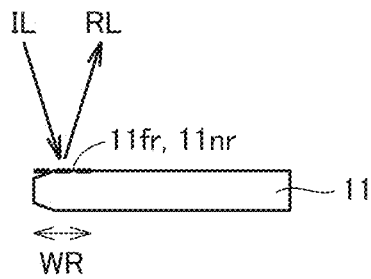
FIG. 4 is an enlarged schematic cross-sectional view showing an exemplary portion of measurement of average residual stress in the gallium nitride crystal substrate according to one manner of the present invention.

FIG. 4 is an enlarged schematic cross-sectional view showing an exemplary portion of measurement of average residual stress in GaN crystal substrate 11 in the present embodiment. Referring to FIG. 4, average residual stress in GaN crystal substrate 11 is calculated by conversion based on 130 MPa per 1 cm$^{-1}$ from an average shift amount of $E_2^H$ peak (approximately 567 cm$^{-1}$ in the absence of residual stress) representing Raman scattered light RL when light IL having a wavelength of 532 nm is emitted to the mirror-finished main surface in first or second flat region 11fr or first or second notch region 11nr.

Since length LR (an OF length and an IF length) of flat portion 11f and the shape and the direction of the central cut of the notch of notch portion 11n of GaN crystal substrate 11 in the present embodiment are the same as length LR (an OF length and an IF length) of flat portion 11f and the shape and the direction of the central cut of the notch of notch portion 11n of GaN crystal substrate 11 in Embodiment I-1, respectively, description will not be repeated.

Embodiment I-3

Referring to FIGS. 1A, 1B, 2A, and 2B, GaN crystal substrate 11 in the present embodiment includes a main surface having a diameter not smaller than 50 mm and not greater than 155 mm and a thickness not smaller than 300 µm and not greater than 800 µm. A part of the outer edge of GaN crystal substrate 11 includes any of flat portion 11f and notch portion 11n. GaN crystal substrate 11 contains any of O atoms, Si atoms, and carriers at a concentration not lower than $2\times10^{17}$ cm$^{-3}$ and not higher than $4\times10^{18}$ cm$^{-3}$. GaN crystal substrate 11 preferably has an average dislocation density not lower than 1000 cm$^{-2}$ and not higher than $5\times10^7$ cm$^{-2}$ and average residual stress not lower than −10 MPa and not higher than 10 MPa in any of first flat region 11fr extending over a width from flat portion 11f to a position at a distance of 2 mm in the direction perpendicular to the straight line indicating flat portion 11f in the main surface and first notch region 11nr extending over a width from notch portion 11n to a position at a distance of 2 mm in the direction perpendicular to the curve indicating notch portion 11n in the main surface. Regarding a value of average residual stress, a negative value represents tensile stress and a positive value represents compressive stress. Since the GaN crystal substrate in the present embodiment has an average dislocation density and average residual stress within respective prescribed ranges in any of the first flat region and the first notch region, it is lower in crack defect ratio in manufacturing of the substrate and in growth of an epitaxial layer on the substrate.

"Being perpendicular to the curve indicating the notch portion in the main surface" in the GaN crystal substrate in the present embodiment means being perpendicular to a tangential line at each point on the curve indicating the notch portion in the main surface. The "curve" here means a line not being straight at least in part and may include a straight line in part. The crack defect ratio is varied by a diameter of the GaN crystal substrate, a type (O atoms or Si atoms) of contained atoms or carriers or a concentration thereof, or a difference in manufacturing of a substrate or growth of an epitaxial layer, and being low in crack defect ratio means a relatively low crack defect ratio so long as a diameter of the GaN crystal substrate, a type (O atoms or Si atoms) of contained atoms and carriers and a concentration thereof, and manufacturing of the substrate or growth of an epitaxial layer are identical.

Since the diameter not smaller than 50 mm and not greater than 155 mm, the thickness not smaller than 300 µm and not greater than 800 µm, and the concentration of O atoms, Si atoms, and carriers not lower than $2\times10^{17}$ cm$^{-3}$ and not higher than $4\times10^{18}$ cm$^{-3}$, of GaN crystal substrate 11 in the present embodiment are the same as the diameter not smaller than 50 mm and not greater than 155 mm, the thickness not smaller than 300 μm and not greater than 800 μm, and the concentration of O atoms, Si atoms, and carriers not lower than $2\times10^{17}$ cm$^{-3}$ and not higher than $4\times10^{18}$ cm$^{-3}$, of GaN crystal substrate 11 in Embodiments I-1 and I-2, respectively, description will not be repeated. Since the average dislocation density and the average residual stress in any of the first flat region and the first notch region of GaN crystal substrate 11 are varied by the concentration of contained O atoms, Si atoms, and carriers, the crack defect ratio can be lowered by adjusting, at a prescribed concentration of O atoms, Si atoms, and carriers, the average dislocation density and the average residual stress in any of the first flat region and the first notch region to be within prescribed ranges.

From a point of view of lowering in crack defect ratio in manufacturing of the substrate and in growth of an epitaxial layer on the substrate in GaN crystal substrate 11 in the present embodiment, GaN crystal substrate 11 preferably has an average dislocation density not lower than 1000 cm$^{-2}$ and not higher than $5\times10^7$ cm$^{-2}$ and average residual stress not lower than −10 MPa and not higher than 10 MPa in any of first flat region 11$fr$ extending over width WR from flat portion 11$f$ to a position at a distance of 2 mm in the direction perpendicular to the straight line indicating flat portion 11$f$ in the main surface and first notch region 11$nr$ extending over width WR from notch portion 11$n$ to a position at a distance of 2 mm in the direction perpendicular to the curve indicating notch portion 11$n$ in the main surface. The average dislocation density in GaN crystal substrate 11 is measured as in Embodiment I-1 and average residual stress in GaN crystal substrate 11 is measured as in Embodiment I-2.

From a point of view of further lowering in crack defect ratio in manufacturing of the substrate and in growth of an epitaxial layer on the substrate in GaN crystal substrate 11 in the present embodiment, GaN crystal substrate 11 more preferably has an average dislocation density not lower than 1000 cm$^{-2}$ and not higher than $5\times10^7$ cm$^{-2}$ and average residual stress not lower than −10 MPa and not higher than 10 MPa in any of second flat region 11$fr$ extending over width WR from flat portion 11$f$ to a position at a distance of 1 mm in the direction perpendicular to the straight line indicating flat portion 11$f$ in the main surface and second notch region 11$nr$ extending over width WR from notch portion 11$n$ to a position at a distance of 1 mm in the direction perpendicular to the curve indicating notch portion 11$n$ in the main surface.

The second flat region and the second notch region are partial regions closer to flat portion 11$f$ and notch portion 11$n$ in the first flat region and the first notch region, respectively. The second flat region and the second notch region which are parts of the first flat region and the first notch region on the outer circumferential side may be higher in average dislocation density and absolute value of average residual stress than the first flat region and the first notch region, respectively. Since crack originates from the outer circumferential portion, values of the average dislocation density and the average residual stress in the second flat region more affect the crack defect ratio. Therefore, the GaN crystal substrate having the average dislocation density and the average residual stress within the ranges above also in the second flat region and the second notch region which may be high in average dislocation density and absolute value of average residual stress is lower in crack defect ratio in manufacturing of the substrate and in growth of an epitaxial layer on the substrate.

Since length LR (an OF length and an IF length) of flat portion 11$f$ and the shape and the direction of the central cut of the notch of notch portion 11$n$ in GaN crystal substrate 11 in the present embodiment are the same as length LR (an OF length and an IF length) of flat portion 11$f$ and the shape and the direction of the central cut of the notch of notch portion 11$n$ in GaN crystal substrate 11 in Embodiments I-1 and I-2, respectively, description will not be repeated.

<Method of Manufacturing GaN Crystal Substrate>

Figure 5A:
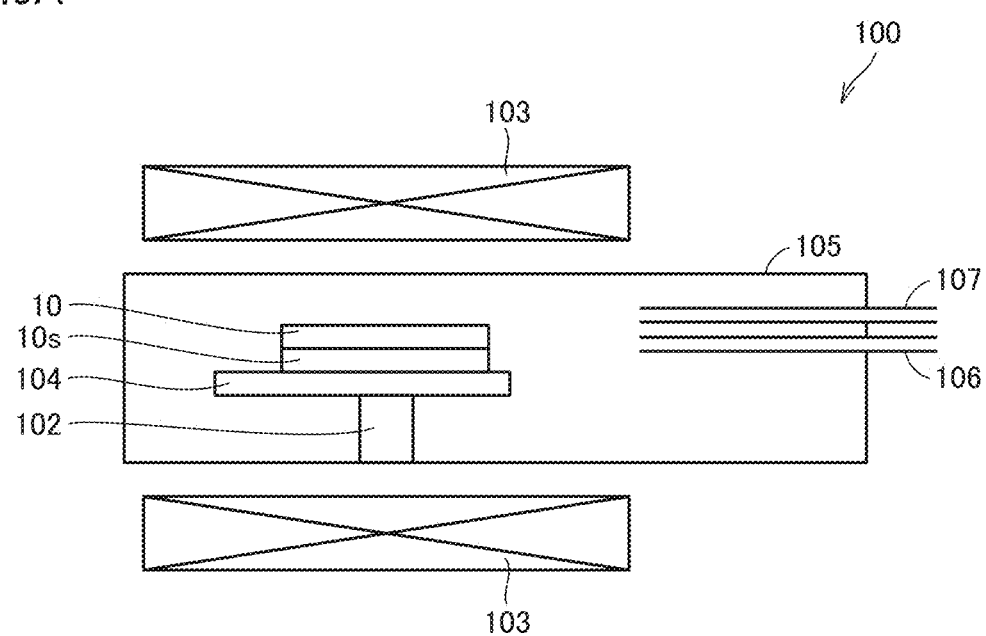
FIG. 5A is a schematic vertical cross-sectional view of the inside of a manufacturing apparatus showing an exemplary method of manufacturing a gallium nitride crystal substrate according to one manner of the present invention.
Figure 5B:
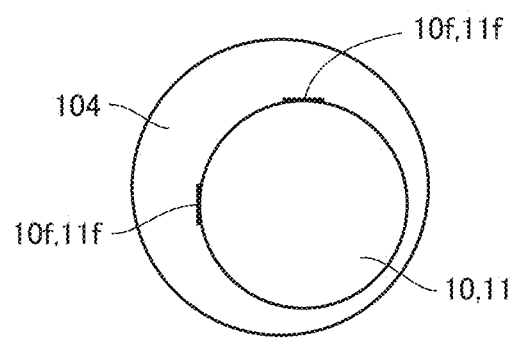
FIG. 5B is a schematic horizontal plan view of a crystal growth portion of the manufacturing apparatus showing the exemplary method of manufacturing a gallium nitride crystal substrate according to one manner of the present invention.
Figure 6A:
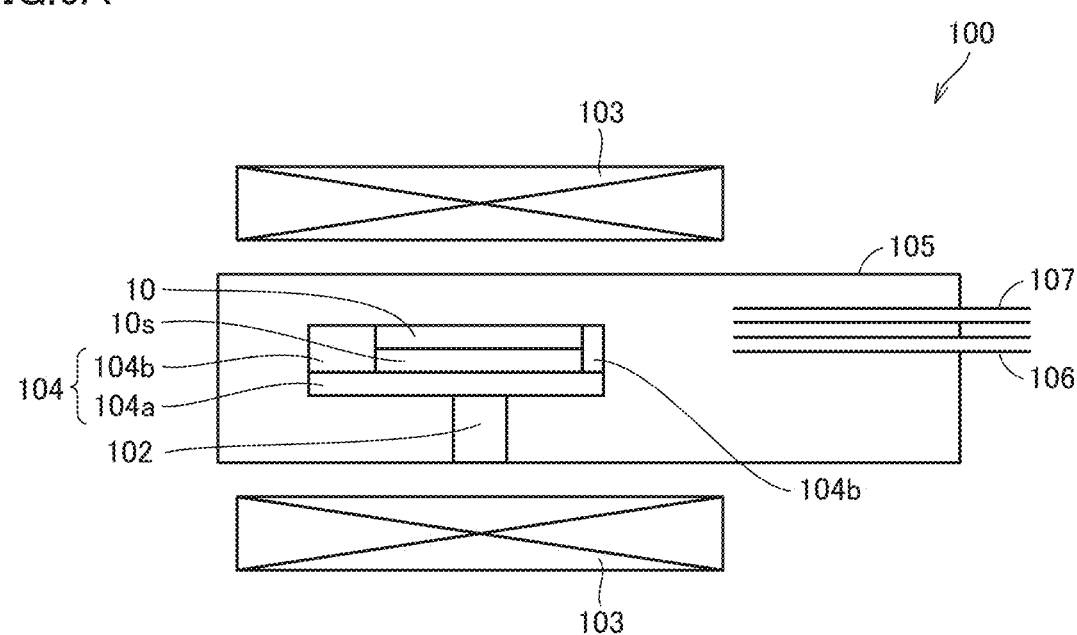
FIG. 6A is a schematic vertical cross-sectional view of the inside of a manufacturing apparatus showing another exemplary method of manufacturing a gallium nitride crystal substrate according to one manner of the present invention.
Figure 6B:
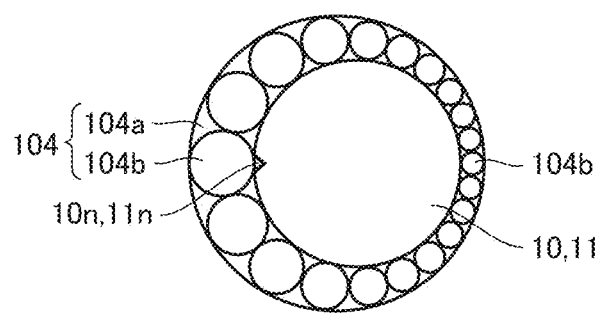
FIG. 6B is a schematic horizontal plan view of a crystal growth portion of the manufacturing apparatus showing another exemplary method of manufacturing a gallium nitride crystal substrate according to one manner of the present invention.
Figure 7A:
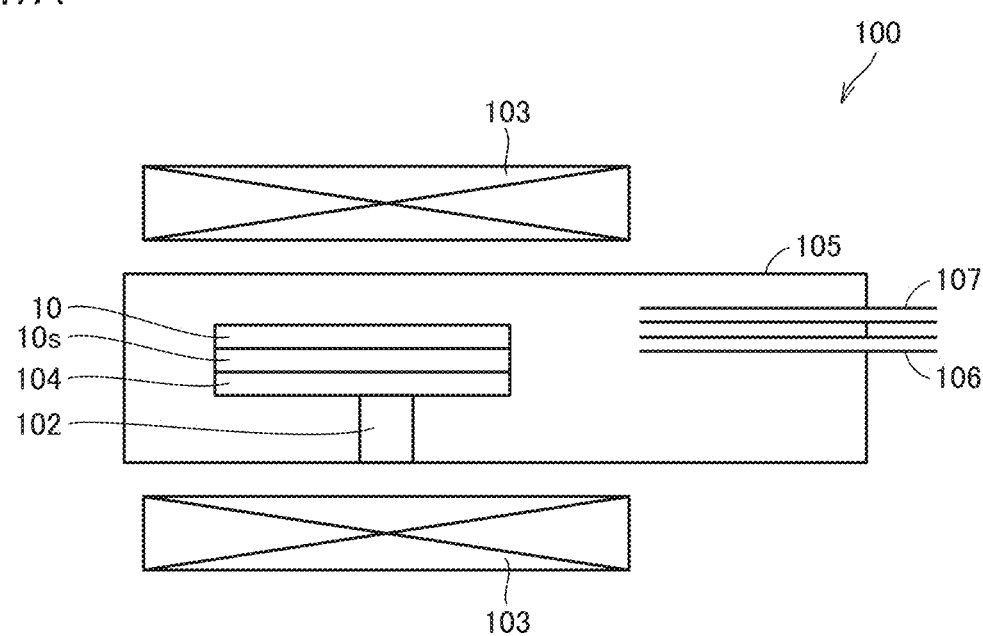
FIG. 7A is a schematic vertical cross-sectional view of the inside of a manufacturing apparatus showing yet another exemplary method of manufacturing a gallium nitride crystal substrate according to one manner of the present invention.
Figure 7B:
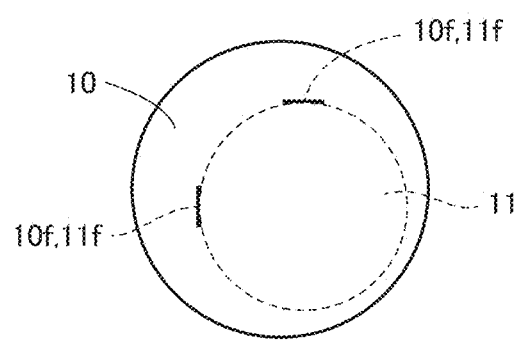
FIG. 7B is a schematic horizontal plan view of a crystal growth portion of the manufacturing apparatus showing yet another exemplary method of manufacturing a gallium nitride crystal substrate according to one manner of the present invention.
Figure 8:
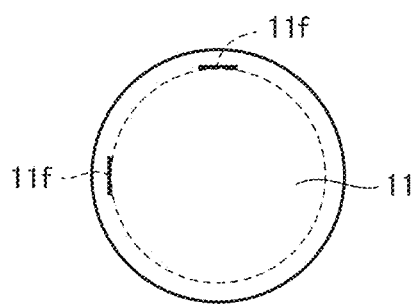
FIG. 8 is a schematic plan view showing still another exemplary method of manufacturing a gallium nitride crystal substrate according to one manner of the present invention.
Figure 8:
Figure 8:
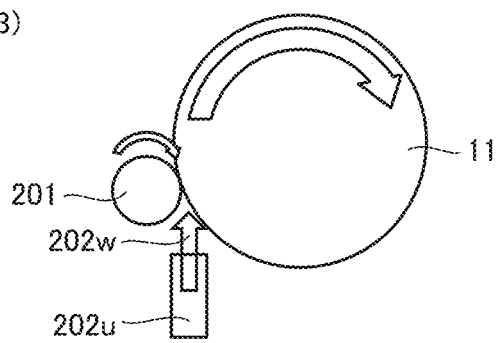
Figure 8:
Figure 8:
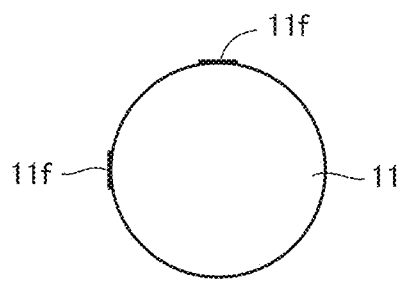

FIGS. 5A, 5B, 6A, 6B, 7A, and 7B are schematic diagrams showing an exemplary method of manufacturing GaN crystal substrate 11 in Embodiments I-1 to I-3. FIGS. 5A, 6A, and 7A are schematic vertical cross-sectional views of the inside of a manufacturing apparatus and FIGS. 5B, 6B, and 7B are schematic horizontal plan views of a crystal growth portion of the manufacturing apparatus. FIG. 8 is a schematic plan view showing another exemplary method of manufacturing GaN crystal substrate 11 in Embodiments I-1 to I-3.

Referring to FIGS. 5A, 5B, 6A, 6B, 7A, 7B, and 8, a general method of manufacturing GaN crystal substrate 11 includes growing crystals by vapor deposition by using a crystal growth apparatus 100 including a base 102 arranged in a crystal growth vessel 105, a Ga source material supply pipe 106 and an N source material supply pipe 107 disposed in crystal growth vessel 105, and a heater 103. Examples of vapor deposition include hydride vapor phase epitaxy (HVPE), molecular beam epitaxy (MBE), and metal-organic chemical vapor deposition (MOCVD). From a point of view of ease in growth of crystals large in thickness and high in crystal growth rate, HVPE is preferred. In HVPE, GaN seed crystal 10$s$ is arranged on base 102 in crystal growth vessel 105. Then, a GaN crystalline body 10 is grown on GaN seed crystal 10$s$ by heating GaN seed crystal 10$s$ by heater 103, supplying gallium chloride (GaCl) gas obtained by reaction between hydrogen chloride (HCl) and metal gallium (Ga) as Ga source material gas into crystal growth vessel 105 through Ga source material supply pipe 106, and supplying ammonia (NH$_3$) gas as N source material gas into crystal growth vessel 105 through N source material supply pipe 107 (FIGS. 5A, 5B, 6A, and 6B). Then, GaN crystalline body 10 is cooled. Then, cooled GaN crystalline body 10 is taken out of crystal growth vessel 105. Then, GaN crystal substrate 11 is cut from taken GaN crystalline body 10 (FIGS. 7A and 7B). Then, by grinding and/or polishing an outer edge (outer circumference) of cut GaN crystal substrate 11, any of flat portion 11$f$ and notch portion 11$n$ is formed in a part of the outer edge (outer circumference) of GaN crystal substrate 11 (FIG. 8). A main surface of GaN crystal substrate 11 having any of flat portion 11$f$ and notch portion 11$n$ formed in a part of the outer edge (outer circumference) is mirror polished.

Embodiment II-1

Referring to FIGS. 5A, 5B, 6A, and 6B, in the method of manufacturing GaN crystal substrate 11 in the present embodiment, a heat-insulating material 104 including a portion high in insulation and a portion low in insulation is arranged on an outer side of the main surface on the side of GaN seed crystal 10$s$, of GaN crystalline body 10 containing GaN seed crystal 10$s$, or on the outer side of the main surface on the side of GaN seed crystal 10$s$, of GaN crystalline body 10 containing GaN seed crystal 10$s$ and an outer side of an outer circumference of GaN crystalline body 10 containing GaN seed crystal 10s (that is, at least the outer side of the main surface on the side of GaN seed crystal 10s, of GaN crystalline body 10 containing GaN seed crystal 10s) in growing and cooling GaN crystalline body 10 or in cooling GaN crystalline body 10 (that is, at least in cooling of GaN crystalline body 10) in the general manufacturing method. In GaN crystalline body 10, a temperature difference between a portion to subsequently be any of flat portion 11f and notch portion 11n of GaN crystal substrate 11 (such a portion also being referred to as an intended flat portion 10f and an intended notch portion 10n of GaN crystalline body 10, to be understood similarly below) and a portion to be an inner side of GaN crystal substrate 11 (such a portion also being referred to as an intended inner substrate portion of GaN crystalline body 10, to be understood similarly below) is thus suppressed, so that a crystal defect such as dislocation and stress in first and second flat regions 11fr and first and second notch regions 11nr in GaN crystal substrate 11 are lessened and an average dislocation density and average residual stress in first and second flat regions 11fr and first and second notch regions 11nr can be adjusted to be within prescribed ranges.

Arrangement of heat-insulating material 104 is not particularly restricted. From the points of view above, however, the portion high in insulation of heat-insulating material 104 is preferably arranged on the outer side of the main surface of any of intended flat portion 10f and intended notch portion 10n (that is, a portion to be any of flat portion 11f and notch portion 11n of GaN crystal substrate 11, to be understood similarly below), or on the outer side of the main surface of any of intended flat portion 10f and intended notch portion 10n and the outer side of the outer edge (outer circumference) of any of intended flat portion 10f and intended notch portion 10n, of GaN crystalline body 10. The portion of heat-insulating material 104 high in insulation is not particularly limited, and examples of such a portion preferably include a portion of the heat-insulating material longer in shortest distance from the outer edge (outer circumference), a portion of the heat-insulating material larger in thickness, or a portion made of a material higher in heat insulation, than other portions.

Preferred specific exemplary arrangement of heat-insulating material 104 is such that heat-insulating material 104 including a portion high in heat insulation is arranged on the outer side of the main surface of any of intended flat portion 10f and intended notch portion 10n. A portion of heat-insulating material 104 longer in shortest distance from the outer edge (outer circumference) (FIGS. 5A and 5B), a portion of the heat-insulating material larger in thickness, or a portion made of a material higher in heat insulation than other portions falls under the portion of heat-insulating material 104 high in heat insulation.

In the arrangement of heat-insulating material 104 shown in FIGS. 5A and 5B, the heat-insulating material including the portion high in heat insulation is arranged on the outer side of the outer edge (outer circumference) of neither of intended flat portion 10f and intended notch portion 10n. GaN crystalline body 10 and GaN crystal substrate 11, however, are manufactured by vapor deposition. Therefore, a thickness (specifically, not smaller than 300 µm and not greater than 800 µm) of the GaN crystalline body and the GaN crystal substrate is generally smaller than a diameter (specifically, not smaller than 50 mm and not greater than 155 mm) of the main surface thereof. Accordingly, when the heat-insulating material including the portion high in heat insulation is arranged on the outer side of the main surface of any of intended flat portion 10f and intended notch portion 10n even though the heat-insulating material including the portion high in heat insulation is arranged on the outer side of the outer edge (outer circumference) of neither of intended flat portion 10f and intended notch portion 10n, a crack defect ratio in manufacturing of the substrate and in growth of an epitaxial layer on the substrate can be low.

Another preferred specific exemplary arrangement of heat-insulating material 104 is such that a heat-insulating material 104a including a portion high in heat insulation is arranged on the outer side of the main surface of any of intended flat portion 10f and intended notch portion 10n and a heat-insulating material 104b including a portion high in heat insulation is arranged on the outer side of the outer edge (outer circumference) of any of intended flat portion 10f and intended notch portion 10n. A portion of heat-insulating material 104a longer in distance in a direction perpendicular to a plane in contact with the outer edge (outer circumference) from the outer circumference toward the inside (FIGS. 6A and 6B), a portion of heat-insulating material 104b larger in thickness (for example, larger in diameter of a cylindrical component), or a portion made of a material higher in heat insulation than other portions falls under the portion of heat-insulating material 104a or 104b high in heat insulation.

So long as heat-insulating material 104a including the portion high in heat insulation is arranged on the outer side of the main surface of any of intended flat portion 10f and intended notch portion 10n and heat-insulating material 104b including the portion high in heat insulation is arranged on the outer side of the outer edge (outer circumference) of any of intended flat portion 10f and intended notch portion 10n, even though GaN crystalline body 10 and GaN crystal substrate 11 are manufactured by vapor deposition to have a thickness (not smaller than approximately 5 mm) relatively large as compared with a diameter of the main surface thereof (not smaller than 50 mm and not greater than 155 mm), a crack defect ratio in manufacturing of the substrate and in growth of an epitaxial layer on the substrate can be low.

Heat-insulating material 104 may be an integrated material as shown in FIGS. 5A and 5B or an assembly of a plurality of components as shown in FIGS. 6A and 6B. As shown in FIG. 6, heat-insulating material 104b arranged on the outer side of the outer edge (outer circumference) of GaN crystalline body 10 containing GaN seed crystal 10s is preferably in contact not with the entirety but with a part of the outer edge (outer circumference) of GaN crystalline body 10.

Though a material for heat-insulating material 104, 104a, or 104b is not particularly restricted so long as it achieves a heat insulating effect, a carbon material, ceramics, silicon nitride (SiN), silicon carbide (SiC), quartz, and a cylindrical container filled with gallium nitride (GaN) are preferred.

Embodiment II-2

Referring to FIGS. 7A and 7B, in the method of manufacturing GaN crystal substrate 11 in the present embodiment, in cutting GaN crystal substrate 11 from taken GaN crystalline body 10 in the general manufacturing method, the GaN crystal substrate is cut such that a portion of GaN crystal substrate 11 where any of flat portion 11f and notch portion 11n is to be formed is located in the inside as being more distant (that is, longer in shortest distance from the outer edge (outer circumference) of GaN crystalline body 10) from the outer edge (outer circumference) of GaN crystalline body 10 than other portions. Thus, a temperature difference between a portion of the GaN crystal substrate where any of flat portion 11f and the notch portion is to be formed and a portion on the inner side in GaN crystal substrate 11 can be suppressed so that a crystal defect such as dislocation and stress in first and second flat regions 11fr and first and second notch regions 11nr of GaN crystal substrate 11 can be lessened and an average dislocation density and average residual stress in first and second flat regions 11fr and first and second notch regions 11nr can be adjusted to be within prescribed ranges.

Embodiment II-3

Referring to FIG. 8, in the method of manufacturing GaN crystal substrate 11 in the present embodiment, in forming any of flat portion 11f and notch portion 11n in a part of the outer edge (outer circumference) of GaN crystal substrate 11 by grinding and/or polishing the outer edge (outer circumference) of cut GaN crystal substrate 11 in the general manufacturing method, a temperature is adjusted to remove heat generated in formation of any of flat portion 11f and notch portion 11n. Thus, a temperature difference between a portion of GaN crystal substrate 11 where any of flat portion 11f and notch portion 11n is formed and a portion on the inner side of GaN crystal substrate 11 can be suppressed so that a crystal defect such as dislocation and stress in first and second flat regions 11fr and first and second notch regions 11nr of GaN crystal substrate 11 can be lessened and an average dislocation density and average residual stress in first and second flat regions 11fr and first and second notch regions 11nr can be adjusted to be within prescribed ranges.

The method of grinding and/or polishing the outer edge (outer circumference) of cut GaN crystal substrate 11 is not particularly restricted, and a grindstone 201 as shown, for example, in FIG. 8 can be employed. The method of adjusting a temperature for removing heat generated in formation of any of flat portion 11f and notch portion 11n is not particularly restricted, and a method of increasing an amount of cooling water 202w injected from a cooling water container 202u and/or a method of lowering a temperature of cooling water 202w only when any of flat portion 11f and notch portion 11n is formed in a part of the outer edge (outer circumference) of GaN crystal substrate 11 are/is available.

In the method of manufacturing GaN crystal substrate 11 in Embodiments II-1 to II-3, by combining the method of manufacturing GaN crystal substrate 11 in Embodiment II-1 with the method of manufacturing GaN crystal substrate 11 in Embodiment II-3 or by combining the method of manufacturing GaN crystal substrate 11 in Embodiment II-2 with the method of manufacturing GaN crystal substrate 11 in Embodiment II-3, a temperature difference between a portion of the GaN crystal substrate where any of flat portion 11f and notch portion 11n is formed and a portion on the inner side of GaN crystal substrate 11 can further be suppressed and a crystal defect such as dislocation and stress in first and second flat regions 11fr and first and second notch regions 11nr of GaN crystal substrate 11 can further be lessened, so that an average dislocation density and average residual stress in first and second flat regions 11fr and first and second notch regions can be adjusted to be within prescribed ranges.

Examples

Experimental Example 1

GaN crystal substrate 11 including a main surface having a plane orientation of (0001), including two flat portions 11f of orientation flat (OF) having a length of 16 mm and identification flat (IF) having a length of 7 mm in an outer edge, and having a diameter of two inches (50.8 mm), a thickness of 400 µm, and an O atomic concentration of $2.0 \times 10^{17}$ cm$^{-3}$ was fabricated by using a crystal growth apparatus shown in FIGS. 5A and 5B. An average dislocation density and average residual stress in first flat region 11fr (a region extending over a width from flat portion 11f to a position at a distance of 2 mm in the direction perpendicular to the straight line indicating flat portion 11f in the main surface) were measured and a crack defect ratio in polishing of the GaN crystal substrate and in growth of a GaN layer having a thickness of 5 µm which is an epitaxial layer on GaN crystal substrate 11 after polishing of the GaN crystal substrate was calculated. An O atomic concentration in GaN crystal substrate 11 was measured by SIMS. Specific description is as follows.

1. Growth of GaN Crystalline Body

GaN crystalline body 10 was grown by the HVPE method shown in FIGS. 5A and 5B. In such crystal growth, heat-insulating material 104 as an integrated material was arranged on the outer side of the main surface on the side of GaN seed crystal 10s, of GaN crystalline body 10 containing GaN seed crystal 10s during growth of GaN crystalline body 10 on GaN seed crystal 10s and during cooling of grown GaN crystalline body 10. Heat-insulating material 104 was formed of solid carbon, and arranged such that a portion of GaN crystalline body 10 corresponding to intended flat portion 10f (an intended OF portion and an intended IF portion) was longer in shortest distance from the outer edge (outer circumference) of heat-insulating material 104 than other portions. Specifically, heat-insulating material 104 was arranged such that the shortest distance between a portion of heat-insulating material 104 located directly under intended flat portion 10f of GaN crystalline body 10 and the outer edge (outer circumference) of heat-insulating material 104 was 5 mm and the shortest distance between a portion other than the portion of heat-insulating material 104 located directly under intended flat portion 10f of GaN crystalline body 10 and the outer edge (outer circumference) of heat-insulating material 104 was 3 mm. Thus, the average dislocation density and average residual stress in the first flat region of obtained GaN crystal substrate 11 could be adjusted to be within prescribed ranges. GaN crystalline body 10 which had undergone crystal growth and cooling was taken out of crystal growth vessel 105.

2. Fabrication of GaN Crystal Substrate

GaN crystal substrate 11 was cut from taken GaN crystalline body 10. By grinding and polishing the outer edge (outer circumference) of cut GaN crystal substrate 11, two flat portions 11f of OF having a length of 16 mm and IF having a length of 7 mm were formed in a part of the outer edge (outer circumference) of GaN crystal substrate 11. An amount of cooling water 202w injected from cooling water container 202u was increased only while flat portion 11f was formed. Thus, the average dislocation density and the average residual stress in the first flat region of obtained GaN crystal substrate 11 could be adjusted to be within prescribed ranges.

3. Evaluation of Average Dislocation Density

The average dislocation density in GaN crystal substrate 11 was measured by using a microscope, as an average per unit area of etch pits (etch pit average density) produced in the main surface of first flat region 11fr after mirror-polishing the main surface of obtained GaN crystal substrate 11 and thereafter immersing GaN crystal substrate 11 for sixty minutes in a potassium hydroxide (KOH) melt at 500° C. Specifically, the entire first flat region was subjected to measurement.

4. Evaluation of Average Residual Stress

Average residual stress in GaN crystal substrate 11 was calculated by conversion based on 130 MPa per 1 cm$^{-1}$ from an average shift amount of $E_2^H$ peak (approximately 567 cm$^{-1}$ in the absence of residual stress) representing Raman scattered light RL when light having a wavelength of 532 nm was emitted to the mirror-polished main surface in first flat region 11fr of obtained GaN crystal substrate 11.

5. Evaluation of Crack Defect Ratio

The crack defect ratio refers to a percentage of samples where crack occurred with respect to the total number of samples in manufacturing of a substrate and in growth of an epitaxial layer below.

(1) In Manufacturing of Substrate

A crack defect ratio of obtained GaN crystal substrate 11 was calculated at the time when the GaN crystal substrate was subjected to polishing as primary polishing for sixty minutes at the number of rotations of 30 rpm with the use of a surface plate made of copper or tin, with an abrasive containing diamond abrasive grains, ethylene glycol, and water being dropped at 5 cm$^3$/minute, and subjected to polishing as finishing polishing for sixty minutes at the number of rotations of 30 rpm with the use of a surface plate or a pad made of tin and having diamond abrasive grains embedded, with an abrasive containing ethylene glycol and water being dropped at 5 cm$^3$/minute.

(2) In Growth of Epitaxial Layer

A crack defect ratio of obtained GaN crystal substrate 11 was calculated after it was subjected to primary polishing and finishing polishing and thereafter a GaN layer was grown for thirty minutes as an epitaxial layer on the main surface subjected to finishing polishing by metal-organic chemical vapor deposition (MOCVD) under such conditions as a temperature of a crystal growth atmosphere of 1050° C., a pressure of the crystal growth atmosphere of 100 kPa, a V/III ratio (representing a ratio of a molarity of a V group element to a molarity of a III group element, to be understood similarly below) of 400, and a crystal growth rate of 4 μm/hour.

Table 1 summarizes a crack defect ratio in manufacturing of the substrate and Table 2 summarizes a crack defect ratio in growth of the epitaxial layer, in combinations of Examples where the average dislocation density in the first flat region was from $1.0 \times 10^3$ cm$^{-2}$ to $5.0 \times 10^7$ cm$^{-2}$ and Comparative Examples where the average dislocation density in the first flat region was $3.5 \times 10^2$ cm$^{-2}$ and $1.0 \times 10^8$ cm$^{-2}$ with Examples where the average residual stress in the first flat region was from −10 MPa to 10 MPa and Comparative Examples where the average residual stress in the first flat region was −20 MPa and 20 MPa in the present Experimental Example (Experimental Example 1).

TABLE 1

| Crack Defect Ratio (%) in Manufacturing of Substrate [O Atomic Concentration: $2.0 \times 10^{17}$ cm$^{-3}$] [Diameter: 2 inches] | | Average Dislocation Density (cm$^{-2}$) | | | | | |
|---|---|---|---|---|---|---|---|
| [First Flat Region] | | $3.5 \times 10^2$ | $1.0 \times 10^3$ | $5.4 \times 10^4$ | $8.6 \times 10^6$ | $5.0 \times 10^7$ | $1.0 \times 10^8$ |
| Average Residual Stress (MPa) | −20 | 4.3 | 2.3 | 2.7 | 2.4 | 2.8 | 3.7 |
| | −10 | 2.4 | 1.1 | 1.8 | 1.3 | 1.4 | 2.5 |
| | −5 | 2.6 | 1.4 | 1.3 | 1.3 | 1.5 | 2.2 |
| | 5 | 2.2 | 1.4 | 1.2 | 1.4 | 1.6 | 2.8 |
| | 10 | 2.5 | 1.5 | 1.5 | 1.1 | 1.6 | 2.5 |
| | 20 | 3.3 | 2.9 | 2.6 | 2.5 | 2.4 | 3.6 |

TABLE 2

| Crack Defect Ratio (%) in Epitaxial Layer Growth [O Atomic Concentration: $2.0 \times 10^{17}$ cm$^{-3}$] [Diameter: 2 inches] | | Average Dislocation Density (cm$^{-2}$) | | | | | |
|---|---|---|---|---|---|---|---|
| [First Flat Region] | | $3.5 \times 10^2$ | $1.0 \times 10^3$ | $5.4 \times 10^4$ | $8.6 \times 10^6$ | $5.0 \times 10^7$ | $1.0 \times 10^8$ |
| Average Residual Stress (MPa) | −20 | 2.2 | 1.5 | 1.4 | 1.7 | 1.8 | 2.3 |
| | −10 | 1.3 | 0.5 | 0.4 | 0.6 | 0.7 | 1.6 |
| | −5 | 1.8 | 0.3 | 0.5 | 0.6 | 0.8 | 1.8 |
| | 5 | 1.6 | 0.4 | 0.4 | 0.8 | 0.6 | 1.6 |
| | 10 | 1.4 | 0.5 | 0.6 | 0.4 | 0.5 | 1.8 |
| | 20 | 3.1 | 1.5 | 1.5 | 1.2 | 1.6 | 2.8 |

Experimental Example 2

The GaN crystal substrate was fabricated, the average dislocation density and the average residual stress in the first flat region were measured, and a crack defect ratio in polishing of the GaN crystal substrate and in growth of the GaN layer which was the epitaxial layer on the GaN crystal substrate after polishing of the GaN crystal substrate was calculated as in Experimental Example 1 except for setting an O atomic concentration to $5.0 \times 10^{17}$ cm$^{-3}$. Table 3 summarizes a crack defect ratio in manufacturing of the substrate and Table 4 summarizes a crack defect ratio in growth of the epitaxial layer, in combinations of Examples where the average dislocation density in the first flat region was from $1.2 \times 10^3$ cm$^{-2}$ to $4.8 \times 10^7$ cm$^{-2}$ and Comparative Examples where the average dislocation density in the first flat region was $4.7 \times 10^2$ cm$^{-2}$ and $1.2 \times 10^8$ cm$^{-2}$ with Examples where the average residual stress in the first flat region was from −9 MPa to 10 MPa and Comparative Examples where the average residual stress in the first flat region was −23 MPa and 22 MPa in the present Experimental Example (Experimental Example 2).

TABLE 3

Crack Defect Ratio (%) in Manufacturing of Substrate
[O Atomic Concentration: $5.0 \times 10^{17}$ cm$^{-3}$]
[Diameter: 2 inches]

| [First Flat Region] | | Average Dislocation Density (cm$^{-2}$) | | | | | |
|---|---|---|---|---|---|---|---|
| | | $4.7 \times 10^2$ | $1.2 \times 10^3$ | $6.7 \times 10^4$ | $1.0 \times 10^7$ | $4.8 \times 10^7$ | $1.2 \times 10^8$ |
| Average Residual Stress (MPa) | −23 | 3.5 | 2.3 | 2.5 | 2.4 | 2.6 | 3.7 |
| | −9 | 2.8 | 1.3 | 1.2 | 1.0 | 0.9 | 2.3 |
| | −4 | 2.6 | 1.2 | 1.4 | 1.0 | 1.2 | 2.2 |
| | 6 | 2.7 | 1.3 | 1.7 | 1.3 | 1.3 | 2.5 |
| | 10 | 2.6 | 1.2 | 1.6 | 1.5 | 1.5 | 2.6 |
| | 22 | 4.8 | 2.5 | 2.6 | 2.8 | 2.3 | 3.5 |

TABLE 4

Crack Defect Ratio (%) in Epitaxial Layer Growth
[O Atomic Concentration: $5.0 \times 10^{17}$ cm$^{-3}$]
[Diameter: 2 inches]

| [First Flat Region] | | Average Dislocation Density (cm$^{-2}$) | | | | | |
|---|---|---|---|---|---|---|---|
| | | $4.7 \times 10^2$ | $1.2 \times 10^3$ | $6.7 \times 10^4$ | $1.0 \times 10^7$ | $4.8 \times 10^7$ | $1.2 \times 10^8$ |
| Average Residual Stress (MPa) | −23 | 3.2 | 1.4 | 1.6 | 1.5 | 1.8 | 2.7 |
| | −9 | 1.1 | 0.5 | 0.7 | 0.4 | 0.9 | 1.9 |
| | −4 | 1.8 | 0.6 | 0.7 | 0.4 | 0.3 | 1.4 |
| | 6 | 1.3 | 0.3 | 0.6 | 0.6 | 0.4 | 1.2 |
| | 10 | 1.5 | 0.8 | 0.7 | 0.5 | 0.7 | 1.8 |
| | 22 | 2.5 | 1.5 | 1.4 | 1.4 | 1.3 | 3.0 |

Experimental Example 3

The GaN crystal substrate was fabricated, the average dislocation density and the average residual stress in the first flat region were measured, and a crack defect ratio in polishing of the GaN crystal substrate and in growth of the GaN layer which was the epitaxial layer on the GaN crystal substrate after polishing of the GaN crystal substrate was calculated as in Experimental Example 1 except for setting an O atomic concentration to $1.0 \times 10^{18}$ cm$^{-3}$. Table 5 summarizes a crack defect ratio in manufacturing of the substrate and Table 6 summarizes a crack defect ratio in growth of the epitaxial layer, in combinations of Examples where the average dislocation density in the first flat region was from $1.1 \times 10^3$ cm$^{-2}$ to $4.7 \times 10^7$ cm$^{-2}$ and Comparative Examples where the average dislocation density in the first flat region was $5.0 \times 10^2$ cm$^{-2}$ and $9.0 \times 10^7$ cm$^{-2}$ with Examples where the average residual stress in the first flat region was from −10 MPa to 10 MPa and Comparative Examples where the average residual stress in the first flat region was −18 MPa and 18 MPa in the present Experimental Example (Experimental Example 3).

TABLE 5

Crack Defect Ratio (%) in Manufacturing of Substrate
[O Atomic Concentration: $1.0 \times 10^{18}$ cm$^{-3}$]
[Diameter: 2 inches]

| [First Flat Region] | | Average Dislocation Density (cm$^{-2}$) | | | | | |
|---|---|---|---|---|---|---|---|
| | | $5.0 \times 10^2$ | $1.1 \times 10^3$ | $7.8 \times 10^4$ | $3.6 \times 10^6$ | $4.7 \times 10^7$ | $9.0 \times 10^7$ |
| Average Residual Stress (MPa) | −18 | 3.6 | 2.4 | 2.3 | 2.4 | 2.8 | 4.8 |
| | −10 | 2.4 | 1.1 | 1.3 | 1.4 | 1.1 | 2.5 |
| | −6 | 2.5 | 1.6 | 0.9 | 1.1 | 1.4 | 2.4 |
| | 5 | 2.6 | 1.4 | 1.4 | 1.5 | 1.3 | 2.8 |
| | 10 | 2.6 | 1.5 | 1.7 | 1.2 | 1.4 | 2.3 |
| | 18 | 3.9 | 2.9 | 2.6 | 2.3 | 2.3 | 3.9 |

TABLE 6

Crack Defect Ratio (%) in Epitaxial Layer Growth
[O Atomic Concentration: $1.0 \times 10^{18}$ cm$^{-3}$]
[Diameter: 2 inches]

| [First Flat Region] | | Average Dislocation Density (cm$^{-2}$) | | | | | |
|---|---|---|---|---|---|---|---|
| | | $5.0 \times 10^2$ | $1.1 \times 10^3$ | $7.8 \times 10^4$ | $3.6 \times 10^6$ | $4.7 \times 10^7$ | $9.0 \times 10^7$ |
| Average Residual Stress (MPa) | −18 | 2.4 | 1.5 | 1.8 | 1.6 | 1.4 | 2.2 |
| | −10 | 1.5 | 0.4 | 0.6 | 0.6 | 0.6 | 1.6 |
| | −6 | 1.3 | 0.8 | 0.7 | 0.4 | 0.7 | 1.3 |
| | 5 | 1.5 | 0.4 | 0.6 | 0.4 | 0.5 | 1.7 |
| | 10 | 1.7 | 0.6 | 0.7 | 0.3 | 0.4 | 1.6 |
| | 18 | 3.2 | 1.8 | 1.6 | 1.7 | 1.8 | 3.1 |

Experimental Example 4

The GaN crystal substrate was fabricated, the average dislocation density and the average residual stress in the first flat region were measured, and a crack defect ratio in polishing of the GaN crystal substrate and in growth of the GaN layer which was the epitaxial layer on the GaN crystal substrate after polishing of the GaN crystal substrate was calculated as in Experimental Example 1 except for setting an O atomic concentration to $4.0 \times 10^{18}$ cm$^{-3}$. Table 7 summarizes a crack defect ratio in manufacturing of the substrate and Table 8 summarizes a crack defect ratio in growth of the epitaxial layer, in combinations of Examples where the average dislocation density in the first flat region was from $1.0 \times 10^3$ cm$^{-2}$ to $4.9 \times 10^7$ cm$^{-2}$ and Comparative Examples where the average dislocation density in the first flat region was $4.2 \times 10^2$ cm$^{-2}$ and $1.5 \times 10^8$ cm$^{-2}$ with Examples where the average residual stress in the first flat region was from −9 MPa to 9 MPa and Comparative Examples where the average residual stress in the first flat region was −21 MPa and 17 MPa in the present Experimental Example (Experimental Example 4).

TABLE 7

Crack Defect Ratio (%) in Manufacturing of Substrate
[O Atomic Concentration: $4.0 \times 10^{18}$ cm$^{-3}$]
[Diameter: 2 inches]

| [First Flat Region] | | Average Dislocation Density (cm$^{-2}$) | | | | | |
|---|---|---|---|---|---|---|---|
| | | $4.2 \times 10^2$ | $1.0 \times 10^3$ | $1.0 \times 10^5$ | $5.2 \times 10^6$ | $4.9 \times 10^7$ | $1.5 \times 10^8$ |
| Average Residual Stress (MPa) | −21 | 3.8 | 2.4 | 2.6 | 2.4 | 2.5 | 3.5 |
| | −9 | 2.5 | 1.3 | 1.2 | 1.5 | 1.3 | 2.8 |
| | −4 | 2.6 | 1.1 | 1.4 | 1.2 | 1.5 | 2.6 |
| | 3 | 2.2 | 1.5 | 1.3 | 1.0 | 1.4 | 2.7 |
| | 9 | 2.4 | 1.4 | 1.3 | 1.1 | 1.6 | 2.6 |
| | 17 | 4.4 | 2.7 | 2.9 | 2.5 | 2.3 | 4.2 |

TABLE 8

Crack Defect Ratio (%) in Epitaxial Layer Growth
[O Atomic Concentration: $4.0 \times 10^{18}$ cm$^{-3}$]
[Diameter: 2 inches]

| [First Flat Region] | | Average Dislocation Density (cm$^{-2}$) | | | | | |
|---|---|---|---|---|---|---|---|
| | | $4.2 \times 10^2$ | $1.0 \times 10^3$ | $1.0 \times 10^5$ | $5.2 \times 10^6$ | $4.9 \times 10^7$ | $1.5 \times 10^8$ |
| Average Residual Stress (MPa) | −21 | 2.6 | 1.6 | 1.4 | 1.5 | 1.6 | 3.4 |
| | −9 | 1.3 | 0.6 | 0.4 | 0.7 | 0.6 | 1.6 |
| | −4 | 1.9 | 0.8 | 0.5 | 0.3 | 0.8 | 1.4 |
| | 3 | 1.5 | 0.5 | 0.4 | 0.6 | 0.3 | 1.8 |
| | 9 | 1.9 | 0.6 | 0.7 | 0.4 | 0.2 | 1.6 |
| | 17 | 2.8 | 1.4 | 1.8 | 1.5 | 1.9 | 2.5 |

Experimental Example 5

The GaN crystal substrate was fabricated, the average dislocation density and the average residual stress in the first flat region were measured, and a crack defect ratio in polishing of the GaN crystal substrate and in growth of the GaN layer which was the epitaxial layer on the GaN crystal substrate after polishing of the GaN crystal substrate was calculated as in Experimental Example 1 except for setting an Si atomic concentration to $2.0 \times 10^{17}$ cm$^{-3}$ instead of the 0 atomic concentration of $2.0 \times 10^{17}$ cm$^{-3}$. An Si atomic concentration in GaN crystal substrate 11 was measured by SIMS. Table 9 summarizes a crack defect ratio in manufacturing of the substrate and Table 10 summarizes a crack defect ratio in growth of the epitaxial layer, in combinations of Examples where the average dislocation density in the first flat region was from $1.1 \times 10^3$ cm$^{-2}$ to $4.8 \times 10^7$ cm$^{-2}$ and Comparative Examples where the average dislocation density in the first flat region was $3.2 \times 10^2$ cm$^{-2}$ and $1.7 \times 10^8$ cm$^{-2}$ with Examples where the average residual stress in the first flat region was from −9 MPa to 10 MPa and Comparative Examples where the average residual stress in the first flat region was −18 MPa and 22 MPa in the present Experimental Example (Experimental Example 5).

TABLE 9

Crack Defect Ratio (%) in Manufacturing of Substrate
[Si Atomic Concentration: $2.0 \times 10^{17}$ cm$^{-3}$]
[Diameter: 2 inches]

| [First Flat Region] | | Average Dislocation Density (cm$^{-2}$) | | | | | |
|---|---|---|---|---|---|---|---|
| | | $3.2 \times 10^2$ | $1.1 \times 10^3$ | $7.8 \times 10^4$ | $5.6 \times 10^6$ | $4.8 \times 10^7$ | $1.7 \times 10^8$ |
| Average Residual Stress (MPa) | −18 | 3.7 | 2.2 | 2.9 | 2.5 | 2.4 | 4.3 |
| | −9 | 2.2 | 1.5 | 1.6 | 1.2 | 1.3 | 2.7 |
| | −5 | 2.6 | 1.6 | 1.5 | 1.4 | 1.4 | 2.6 |
| | 6 | 2.1 | 1.2 | 1.3 | 1.5 | 1.5 | 2.7 |
| | 10 | 2.7 | 1.4 | 1.1 | 1.5 | 1.6 | 2.4 |
| | 22 | 3.6 | 2.6 | 2.2 | 2.5 | 2.5 | 7.0 |

TABLE 10

Crack Defect Ratio (%) in Epitaxial Layer Growth
[Si Atomic Concentration: $2.0 \times 10^{17}$ cm$^{-3}$]
[Diameter: 2 inches]

| [First Flat Region] | | Average Dislocation Density (cm$^{-2}$) | | | | | |
|---|---|---|---|---|---|---|---|
| | | $3.2 \times 10^2$ | $1.1 \times 10^3$ | $7.8 \times 10^4$ | $5.6 \times 10^6$ | $4.8 \times 10^7$ | $1.7 \times 10^8$ |
| Average Residual Stress (MPa) | −18 | 2.3 | 1.4 | 1.3 | 1.3 | 1.2 | 2.6 |
| | −9 | 1.2 | 0.6 | 0.7 | 0.5 | 0.7 | 1.6 |
| | −5 | 1.7 | 0.3 | 0.5 | 0.2 | 0.3 | 1.5 |
| | 6 | 1.8 | 0.2 | 0.5 | 0.4 | 0.5 | 1.6 |
| | 10 | 1.2 | 0.6 | 0.4 | 0.4 | 0.4 | 1.4 |
| | 22 | 2.3 | 1.6 | 1.3 | 1.5 | 1.5 | 2.5 |

Experimental Example 6

The GaN crystal substrate was fabricated, the average dislocation density and the average residual stress in the first flat region were measured, and a crack defect ratio in polishing of the GaN crystal substrate and in growth of the GaN layer which was the epitaxial layer on the GaN crystal substrate after polishing of the GaN crystal substrate was calculated as in Experimental Example 5 except for setting an Si atomic concentration to $6.0 \times 10^{17}$ cm$^{-3}$. Table 11 summarizes a crack defect ratio in manufacturing of the substrate and Table 12 summarizes a crack defect ratio in growth of the epitaxial layer, in combinations of Examples where the average dislocation density in the first flat region was from $1.0 \times 10^3$ cm$^{-2}$ to $4.9 \times 10^7$ cm$^{-2}$ and Comparative Examples where the average dislocation density in the first flat region was $4.0 \times 10^2$ cm$^{-2}$ and $9.6 \times 10^7$ cm$^{-2}$ with Examples where the average residual stress in the first flat region was from −10 MPa to 9 MPa and Comparative Examples where the average residual stress in the first flat region was −20 MPa and 21 MPa in the present Experimental Example (Experimental Example 6).

TABLE 11

Crack Defect Ratio (%) in Manufacturing of Substrate
[Si Atomic Concentration: $6.0 \times 10^{17}$ cm$^{-3}$]
[Diameter: 2 inches]

| [First Flat Region] | | Average Dislocation Density (cm$^{-2}$) | | | | | |
|---|---|---|---|---|---|---|---|
| | | $4.0 \times 10^2$ | $1.0 \times 10^3$ | $4.8 \times 10^4$ | $1.2 \times 10^7$ | $4.9 \times 10^7$ | $9.6 \times 10^7$ |
| Average Residual Stress (MPa) | −20 | 3.6 | 2.2 | 2.6 | 2.7 | 2.5 | 4.2 |
| | −10 | 2.3 | 1.5 | 1.3 | 1.2 | 1.2 | 2.2 |
| | −7 | 2.8 | 1.3 | 1.5 | 1.2 | 1.3 | 2.7 |
| | 4 | 2.6 | 1.4 | 1.6 | 1.1 | 1.4 | 2.6 |
| | 9 | 2.4 | 1.3 | 1.6 | 1.6 | 1.5 | 2.5 |
| | 21 | 3.8 | 2.5 | 2.8 | 2.3 | 2.4 | 3.6 |

TABLE 12

Crack Defect Ratio (%) in Epitaxial Layer Growth
[Si Atomic Concentration: $6.0 \times 10^{17}$ cm$^{-3}$]
[Diameter: 2 inches]

| [First Flat Region] | | Average Dislocation Density (cm$^{-2}$) | | | | | |
|---|---|---|---|---|---|---|---|
| | | $4.0 \times 10^2$ | $1.0 \times 10^3$ | $4.8 \times 10^4$ | $1.2 \times 10^7$ | $4.9 \times 10^7$ | $9.6 \times 10^7$ |
| Average Residual Stress (MPa) | −20 | 2.7 | 1.5 | 1.5 | 1.2 | 1.4 | 2.4 |
| | −10 | 1.3 | 0.3 | 0.5 | 0.8 | 0.5 | 1.5 |
| | −7 | 1.5 | 0.5 | 0.8 | 0.4 | 0.6 | 1.6 |
| | 4 | 1.6 | 0.4 | 0.5 | 0.5 | 0.8 | 1.7 |
| | 9 | 1.4 | 0.2 | 0.3 | 0.6 | 0.4 | 1.8 |
| | 21 | 3.0 | 1.8 | 1.5 | 1.7 | 1.5 | 2.8 |

Experimental Example 7

The GaN crystal substrate was fabricated, the average dislocation density and the average residual stress in the first flat region were measured, and a crack defect ratio in polishing of the GaN crystal substrate and in growth of the GaN layer which was the epitaxial layer on the GaN crystal substrate after polishing of the GaN crystal substrate was calculated as in Experimental Example 5 except for setting an Si atomic concentration to $1.5 \times 10^{18}$ cm$^{-3}$. Table 13 summarizes a crack defect ratio in manufacturing of the substrate and Table 14 summarizes a crack defect ratio in growth of the epitaxial layer, in combinations of Examples where the average dislocation density in the first flat region was from $1.2 \times 10^3$ cm$^{-2}$ to $4.9 \times 10^7$ cm$^{-2}$ and Comparative Examples where the average dislocation density in the first flat region was $6.5 \times 10^2$ cm$^{-2}$ and $1.2 \times 10^8$ cm$^{-2}$ with Examples where the average residual stress in the first flat region was from −9 MPa to 10 MPa and Comparative Examples where the average residual stress in the first flat region was −23 MPa and 24 MPa in the present Experimental Example (Experimental Example 7).

TABLE 13

Crack Defect Ratio (%) in Manufacturing of Substrate
[Si Atomic Concentration: $1.5 \times 10^{18}$ cm$^{-3}$]
[Diameter: 2 inches]

| [First Flat Region] | | Average Dislocation Density (cm$^{-2}$) | | | | | |
|---|---|---|---|---|---|---|---|
| | | $6.5 \times 10^2$ | $1.2 \times 10^3$ | $1.5 \times 10^4$ | $1.4 \times 10^6$ | $4.9 \times 10^7$ | $1.2 \times 10^8$ |
| Average Residual Stress (MPa) | −23 | 3.3 | 2.6 | 2.4 | 2.8 | 2.5 | 3.8 |
| | −9 | 2.5 | 1.5 | 1.4 | 1.5 | 1.0 | 2.6 |
| | −3 | 2.6 | 0.9 | 0.9 | 1.3 | 1.3 | 2.4 |
| | 2 | 2.3 | 1.0 | 1.5 | 1.2 | 1.2 | 2.5 |
| | 10 | 2.4 | 1.2 | 1.6 | 1.4 | 1.3 | 2.2 |
| | 24 | 3.6 | 2.1 | 2.6 | 2.7 | 2.2 | 3.5 |

TABLE 14

Crack Defect Ratio (%) in Epitaxial Layer Growth
[Si Atomic Concentration: $1.5 \times 10^{18}$ cm$^{-3}$]
[Diameter: 2 inches]

| [First Flat Region] | | Average Dislocation Density (cm$^{-2}$) | | | | | |
|---|---|---|---|---|---|---|---|
| | | $6.5 \times 10^2$ | $1.2 \times 10^3$ | $1.5 \times 10^4$ | $1.4 \times 10^6$ | $4.9 \times 10^7$ | $1.2 \times 10^8$ |
| Average Residual Stress (MPa) | −23 | 2.5 | 1.6 | 1.5 | 1.7 | 1.5 | 3.5 |
| | −9 | 1.9 | 0.5 | 0.1 | 0.8 | 0.8 | 1.6 |
| | −3 | 1.6 | 0.5 | 0.3 | 0.4 | 0.8 | 1.3 |
| | 2 | 1.2 | 0.4 | 0.6 | 0.5 | 0.7 | 1.2 |

TABLE 14-continued

Crack Defect Ratio (%) in Epitaxial Layer Growth
[Si Atomic Concentration: $1.5 \times 10^{18}$ cm$^{-3}$]
[Diameter: 2 inches]

| [First Flat Region] | | Average Dislocation Density (cm$^{-2}$) | | | | | |
|---|---|---|---|---|---|---|---|
| | | $6.5 \times 10^2$ | $1.2 \times 10^3$ | $1.5 \times 10^4$ | $1.4 \times 10^6$ | $4.9 \times 10^7$ | $1.2 \times 10^8$ |
| | 10 | 1.3 | 0.8 | 0.5 | 0.6 | 0.7 | 1.8 |
| | 24 | 3.3 | 1.4 | 1.6 | 1.5 | 1.7 | 3.5 |

Experimental Example 8

The GaN crystal substrate was fabricated, the average dislocation density and the average residual stress in the first flat region were measured, and a crack defect ratio in polishing of the GaN crystal substrate and in growth of the GaN layer which was the epitaxial layer on the GaN crystal substrate after polishing of the GaN crystal substrate was calculated as in Experimental Example 5 except for setting an Si atomic concentration to $4.0 \times 10^{18}$ cm$^{-3}$. Table 15 summarizes a crack defect ratio in manufacturing of the substrate and Table 16 summarizes a crack defect ratio in growth of the epitaxial layer, in combinations of Examples where the average dislocation density in the first flat region was from $1.1 \times 10^3$ cm$^{-2}$ to $4.8 \times 10^7$ cm$^{-2}$ and Comparative Examples where the average dislocation density in the first flat region was $6.2 \times 10^2$ cm$^{-2}$ and $8.8 \times 10^7$ cm$^{-2}$ with Examples where the average residual stress in the first flat region was from −9 MPa to 10 MPa and Comparative Examples where the average residual stress in the first flat region was −18 MPa and 22 MPa in the present Experimental Example (Experimental Example 8).

TABLE 15

Crack Defect Ratio (%) in Manufacturing of Substrate
[Si Atomic Concentration: $4.0 \times 10^{18}$ cm$^{-3}$]
[Diameter: 2 inches]

| | [First Flat Region] | Average Dislocation Density (cm$^{-2}$) | | | | | |
|---|---|---|---|---|---|---|---|
| | | $6.2 \times 10^2$ | $1.1 \times 10^3$ | $5.7 \times 10^5$ | $2.4 \times 10^6$ | $4.8 \times 10^7$ | $8.8 \times 10^7$ |
| Average Residual Stress (MPa) | −18 | 3.4 | 2.6 | 2.4 | 2.5 | 2.4 | 3.6 |
| | −9 | 2.5 | 1.2 | 1.6 | 1.6 | 1.3 | 2.4 |
| | −7 | 2.6 | 1.0 | 1.5 | 1.3 | 1.7 | 2.8 |
| | 4 | 2.5 | 1.3 | 1.6 | 1.0 | 1.3 | 2.4 |
| | 10 | 2.8 | 1.3 | 1.4 | 1.2 | 1.2 | 2.2 |
| | 22 | 3.9 | 2.5 | 2.5 | 2.7 | 2.6 | 3.8 |

TABLE 16

Crack Defect Ratio (%) in Epitaxial Layer Growth
[Si Atomic Concentration: $4.0 \times 10^{18}$ cm$^{-3}$]
[Diameter: 2 inches]

| | [First Flat Region] | Average Dislocation Density (cm$^{-2}$) | | | | | |
|---|---|---|---|---|---|---|---|
| | | $6.2 \times 10^2$ | $1.1 \times 10^3$ | $5.7 \times 10^5$ | $2.4 \times 10^6$ | $4.8 \times 10^7$ | $8.8 \times 10^7$ |
| Average Residual Stress (MPa) | −18 | 2.7 | 1.5 | 1.2 | 1.3 | 1.4 | 3.2 |
| | −9 | 1.5 | 0.9 | 0.4 | 0.1 | 0.4 | 1.5 |
| | −7 | 1.4 | 0.4 | 0.4 | 0.3 | 0.3 | 1.3 |
| | 4 | 1.6 | 0.6 | 0.1 | 0.5 | 0.4 | 1.4 |
| | 10 | 1.8 | 0.5 | 0.6 | 0.6 | 0.6 | 1.8 |
| | 22 | 2.6 | 1.6 | 1.7 | 1.6 | 1.8 | 2.8 |

Experimental Example 9

The GaN crystal substrate was fabricated, the average dislocation density and the average residual stress in the first flat region were measured, and a crack defect ratio in polishing of the GaN crystal substrate and in growth of the GaN layer which was the epitaxial layer on the GaN crystal substrate after polishing of the GaN crystal substrate was calculated as in Experimental Example 1 except for setting a carrier concentration to $2.0\times10^{17}$ cm$^{-3}$ instead of the O atomic concentration of $2.0\times10^{17}$ cm$^{-3}$. Table 17 summarizes a crack defect ratio in manufacturing of the substrate and Table 18 summarizes a crack defect ratio in growth of the epitaxial layer, in combinations of Examples where the average dislocation density in the first flat region was from $1.1\times10^3$ cm$^{-2}$ to $4.9\times10^7$ cm$^2$ and Comparative Examples where the average dislocation density in the first flat region was $5.4\times10^2$ cm$^{-2}$ and $1.5\times10^8$ cm$^{-2}$ with Examples where the average residual stress in the first flat region was from −10 MPa to 9 MPa and Comparative Examples where the average residual stress in the first flat region was −21 MPa and 24 MPa in the present Experimental Example (Experimental Example 9).

TABLE 17

Crack Defect Ratio (%) in Manufacturing of Substrate
[Carrier Concentration: $2.0 \times 10^{17}$ cm$^{-3}$]
[Diameter: 2 inches]

| [First Flat Region] | | Average Dislocation Density (cm$^{-2}$) | | | | | |
|---|---|---|---|---|---|---|---|
| | | $5.4 \times 10^2$ | $1.1 \times 10^3$ | $1.0 \times 10^5$ | $7.5 \times 10^6$ | $4.9 \times 10^7$ | $1.5 \times 10^8$ |
| Average Residual Stress (MPa) | −21 | 4.2 | 2.4 | 2.7 | 2.5 | 2.5 | 4.3 |
| | −10 | 2.5 | 1.5 | 1.1 | 1.2 | 1.3 | 2.4 |
| | −7 | 2.3 | 1.3 | 1.1 | 1.2 | 1.4 | 2.3 |
| | 7 | 2.5 | 1.3 | 1.3 | 1.3 | 1.2 | 2.8 |
| | 9 | 2.8 | 1.6 | 1.4 | 1.4 | 1.3 | 2.9 |
| | 24 | 4.1 | 2.5 | 2.7 | 2.6 | 2.9 | 3.5 |

TABLE 18

Crack Defect Ratio (%) in Epitaxial Layer Growth
[Carrier Concentration: $2.0 \times 10^{17}$ cm$^{-3}$]
[Diameter: 2 inches]

| [First Flat Region] | | Average Dislocation Density (cm$^{-2}$) | | | | | |
|---|---|---|---|---|---|---|---|
| | | $5.4 \times 10^2$ | $1.1 \times 10^3$ | $1.0 \times 10^5$ | $7.5 \times 10^6$ | $4.9 \times 10^7$ | $1.5 \times 10^8$ |
| Average Residual Stress (MPa) | −21 | 2.3 | 1.6 | 1.5 | 1.2 | 1.4 | 2.6 |
| | −10 | 1.2 | 1.2 | 1.3 | 0.5 | 0.4 | 1.4 |
| | −7 | 1.6 | 0.6 | 0.4 | 0.6 | 0.7 | 1.5 |
| | 7 | 1.4 | 0.3 | 0.2 | 0.4 | 0.2 | 1.7 |
| | 9 | 1.3 | 0.3 | 0.6 | 0.4 | 0.5 | 1.5 |
| | 24 | 2.8 | 1.3 | 1.6 | 1.4 | 1.5 | 2.7 |

TABLE 19

Crack Defect Ratio (%) in Manufacturing of Substrate
[Carrier Concentration: $4.7 \times 10^{17}$ cm$^{-3}$]
[Diameter: 2 inches]

| [First Flat Region] | | Average Dislocation Density (cm$^{-2}$) | | | | | |
|---|---|---|---|---|---|---|---|
| | | $3.5 \times 10^2$ | $1.0 \times 10^3$ | $5.7 \times 10^4$ | $2.0 \times 10^6$ | $5.0 \times 10^7$ | $8.8 \times 10^7$ |
| Average Residual Stress (MPa) | −19 | 3.6 | 2.5 | 2.3 | 2.3 | 2.4 | 3.8 |
| | −9 | 2.4 | 1.4 | 1.6 | 1.4 | 1.4 | 2.4 |
| | −2 | 2.5 | 1.3 | 1.3 | 1.5 | 1.3 | 2.5 |
| | 3 | 2.6 | 1.5 | 1.3 | 1.2 | 1.4 | 2.8 |
| | 9 | 2.4 | 1.5 | 1.2 | 1.3 | 1.1 | 2.2 |
| | 20 | 4.1 | 2.5 | 2.3 | 2.5 | 2.1 | 4.2 |

TABLE 20

Crack Defect Ratio (%) in Epitaxial Layer Growth
[Carrier Concentration: $4.7 \times 10^{17}$ cm$^{-3}$]
[Diameter: 2 inches]

| [First Flat Region] | | Average Dislocation Density (cm$^{-2}$) | | | | | |
|---|---|---|---|---|---|---|---|
| | | $3.5 \times 10^2$ | $1.0 \times 10^3$ | $5.7 \times 10^4$ | $2.0 \times 10^6$ | $5.0 \times 10^7$ | $8.8 \times 10^7$ |
| Average Residual Stress (MPa) | −19 | 3.3 | 1.5 | 1.6 | 1.7 | 1.5 | 3.3 |
| | −9 | 1.2 | 0.3 | 0.4 | 0.7 | 0.3 | 1.5 |
| | −2 | 1.3 | 0.2 | 0.6 | 0.4 | 0.3 | 1.8 |
| | 3 | 1.5 | 0.3 | 0.4 | 0.6 | 0.5 | 1.6 |
| | 9 | 1.6 | 0.3 | 0.8 | 0.5 | 0.5 | 1.7 |
| | 20 | 3.2 | 1.4 | 1.5 | 1.6 | 1.6 | 3.6 |

Experimental Example 10

The GaN crystal substrate was fabricated, the average dislocation density and the average residual stress in the first flat region were measured, and a crack defect ratio in polishing of the GaN crystal substrate and in growth of the GaN layer which was the epitaxial layer on the GaN crystal substrate after polishing of the GaN crystal substrate was calculated as in Experimental Example 9 except for setting a carrier concentration to $4.7\times10^{17}$ cm$^{-3}$. Table 19 summarizes a crack defect ratio in manufacturing of the substrate and Table 20 summarizes a crack defect ratio in growth of the epitaxial layer, in combinations of Examples where the average dislocation density in the first flat region was from $1.0\times10^3$ cm$^{-2}$ to $5.0\times10^7$ cm$^{-2}$ and Comparative Examples where the average dislocation density in the first flat region was $3.5\times10^2$ cm$^{-2}$ and $8.8\times10^7$ cm$^{-2}$ with Examples where the average residual stress in the first flat region was from −9 MPa to 9 MPa and Comparative Examples where the average residual stress in the first flat region was −19 MPa and 20 MPa in the present Experimental Example (Experimental Example 10).

Experimental Example 11

The GaN crystal substrate was fabricated, the average dislocation density and the average residual stress in the first flat region were measured, and a crack defect ratio in polishing of the GaN crystal substrate and in growth of the GaN layer which was the epitaxial layer on the GaN crystal substrate after polishing of the GaN crystal substrate was calculated as in Experimental Example 9 except for setting a carrier concentration to $1.5\times10^{18}$ cm$^{-3}$. Table 21 summarizes a crack defect ratio in manufacturing of the substrate and Table 22 summarizes a crack defect ratio in growth of the epitaxial layer, in combinations of Examples where the average dislocation density in the first flat region was from $1.2\times10^3$ cm$^{-2}$ to $5.0\times10^7$ cm$^{-2}$ and Comparative Examples where the average dislocation density in the first flat region was $5.1\times10^2$ cm$^{-2}$ and $1.7\times10^8$ cm$^{-2}$ with Examples where the average residual stress in the first flat region was from −10 MPa to 9 MPa and Comparative Examples where the average residual stress in the first flat region was −22 MPa and 24 MPa in the present Experimental Example (Experimental Example 11).

TABLE 21

Crack Defect Ratio (%) in Manufacturing of Substrate
[Carrier Concentration: 1.5 × 10$^{18}$ cm$^{-3}$]

Average Dislocation Density (cm$^{-2}$)

[Diameter: 2 inches]
[First Flat Region]

| | | 5.1 × 10$^2$ | 1.2 × 10$^3$ | 3.0 × 10$^4$ | 1.2 × 10$^6$ | 5.0 × 10$^7$ | 1.7 × 10$^8$ |
|---|---|---|---|---|---|---|---|
| Average Residual Stress (MPa) | −22 | 3.5 | 2.3 | 2.1 | 2.5 | 2.6 | 3.8 |
| | −10 | 2.8 | 1.0 | 1.5 | 1.5 | 1.2 | 2.4 |
| | −4 | 2.7 | 1.2 | 1.4 | 1.4 | 1.5 | 2.6 |
| | 4 | 2.5 | 1.3 | 1.6 | 1.3 | 1.6 | 2.5 |
| | 9 | 2.3 | 1.4 | 1.5 | 1.5 | 1.3 | 2.9 |
| | 24 | 4.1 | 2.5 | 2.6 | 2.4 | 2.4 | 3.5 |

TABLE 22

Crack Defect Ratio (%) in Epitaxial Layer Growth
[Carrier Concentration: 1.5 × 10$^{18}$ cm$^{-3}$]

Average Dislocation Density (cm$^{-2}$)

[Diameter: 2 inches]
[First Flat Region]

| | | 5.1 × 10$^2$ | 1.2 × 10$^3$ | 3.0 × 10$^4$ | 1.2 × 10$^6$ | 5.0 × 10$^7$ | 1.7 × 10$^8$ |
|---|---|---|---|---|---|---|---|
| Average Residual Stress (MPa) | −22 | 3.8 | 1.5 | 1.6 | 1.4 | 1.8 | 2.8 |
| | −10 | 1.4 | 0.3 | 0.4 | 0.4 | 0.6 | 1.6 |
| | −4 | 1.5 | 0.5 | 0.6 | 0.5 | 0.5 | 1.5 |
| | 4 | 1.6 | 0.3 | 0.3 | 0.3 | 0.6 | 1.7 |
| | 9 | 1.4 | 0.2 | 0.4 | 0.2 | 0.4 | 1.4 |
| | 24 | 3.3 | 1.6 | 1.5 | 1.6 | 1.7 | 3.3 |

Experimental Example 12

The GaN crystal substrate was fabricated, the average dislocation density and the average residual stress in the first flat region were measured, and a crack defect ratio in polishing of the GaN crystal substrate and in growth of the GaN layer which was the epitaxial layer on the GaN crystal substrate after polishing of the GaN crystal substrate was calculated as in Experimental Example 9 except for setting a carrier concentration to 4.0×10$^{18}$ cm$^{-3}$. Table 23 summarizes a crack defect ratio in manufacturing of the substrate and Table 24 summarizes a crack defect ratio in growth of the epitaxial layer, in combinations of Examples where the average dislocation density in the first flat region was from 1.1×10$^3$ cm$^{-2}$ to 4.8×10$^7$ cm$^{-2}$ and Comparative Examples where the average dislocation density in the first flat region was 6.5×10$^2$ cm$^{-2}$ and 2.0×10$^8$ cm$^{-2}$ with Examples where the average residual stress in the first flat region was from −10 MPa to 10 MPa and Comparative Examples where the average residual stress in the first flat region was −25 MPa and 18 MPa in the present Experimental Example (Experimental Example 12).

TABLE 23

Crack Defect Ratio (%) in Manufacturing of Substrate
[Carrier Concentration: 4.0 × 10$^{18}$ cm$^{-3}$]

Average Dislocation Density (cm$^{-2}$)

[Diameter: 2 inches]
[First Flat Region]

| | | 6.5 × 10$^2$ | 1.1 × 10$^3$ | 8.5 × 10$^4$ | 2.7 × 10$^6$ | 4.8 × 10$^7$ | 2.0 × 10$^8$ |
|---|---|---|---|---|---|---|---|
| Average Residual Stress (MPa) | −25 | 3.7 | 2.3 | 2.6 | 2.5 | 2.4 | 3.6 |
| | −10 | 2.8 | 1.2 | 1.1 | 1.8 | 1.4 | 2.8 |
| | −2 | 2.6 | 1.2 | 1.4 | 1.7 | 1.6 | 2.9 |
| | 6 | 2.5 | 1.5 | 1.4 | 1.6 | 1.4 | 2.8 |

TABLE 23-continued

Crack Defect Ratio (%) in Manufacturing of Substrate
[Carrier Concentration: 4.0 × 10$^{18}$ cm$^{-3}$]

Average Dislocation Density (cm$^{-2}$)

[Diameter: 2 inches]
[First Flat Region]

| | | 6.5 × 10$^2$ | 1.1 × 10$^3$ | 8.5 × 10$^4$ | 2.7 × 10$^6$ | 4.8 × 10$^7$ | 2.0 × 10$^8$ |
|---|---|---|---|---|---|---|---|
| | 10 | 2.3 | 1.6 | 1.6 | 1.8 | 1.5 | 2.5 |
| | 18 | 3.7 | 2.5 | 2.4 | 2.4 | 2.3 | 4.1 |

TABLE 24

Crack Defect Ratio (%) in Epitaxial Layer Growth
[Carrier Concentration: 4.0 × 10$^{18}$ cm$^{-3}$]

Average Dislocation Density (cm$^{-2}$)

[Diameter: 2 inches]
[First Flat Region]

| | | 6.5 × 10$^2$ | 1.1 × 10$^3$ | 8.5 × 10$^4$ | 2.7 × 10$^6$ | 4.8 × 10$^7$ | 2.0 × 10$^8$ |
|---|---|---|---|---|---|---|---|
| Average Residual Stress (MPa) | −25 | 2.4 | 1.5 | 1.6 | 1.5 | 1.4 | 2.9 |
| | −10 | 1.5 | 0.4 | 0.2 | 0.1 | 0.7 | 1.5 |
| | −2 | 1.9 | 0.6 | 0.6 | 0.3 | 0.5 | 1.8 |
| | 6 | 1.6 | 0.5 | 0.1 | 0.5 | 0.6 | 1.6 |
| | 10 | 1.5 | 0.4 | 0.8 | 0.4 | 0.7 | 1.3 |
| | 18 | 3.2 | 1.6 | 1.6 | 1.9 | 1.8 | 3.0 |

Experimental Example 13

GaN crystal substrate 11 including a main surface having the plane orientation of (0001), a diameter of four inches (101.6 mm), a thickness of 400 μm, and a carrier concentration of 1×10$^{18}$ cm$^{-3}$ and including notch portion 11n machined by cutting off a portion extending by 1.0 mm from the outer edge toward the center at an opening angle of 90° in the direction of the M axis ([1-100]) when the direction of the central cut of the notch was viewed from the center of the substrate was fabricated by using the crystal growth apparatus shown in FIGS. 6A and 6B. The average dislocation density and the average residual stress in first notch region 11nr (a region extending over a width from notch portion 11n to a position at a distance of 2 mm in the direction perpendicular to the curve indicating notch portion 11n in the main surface) were measured, and a crack defect ratio in polishing of the GaN crystal substrate and in growth of the GaN layer which was the epitaxial layer on the GaN crystal substrate after polishing of the GaN crystal substrate was calculated. Specific description is as follows.

1. Growth of GaN Crystal

GaN crystalline body 10 was grown by the HVPE method shown in FIGS. 6A and 6B. In such crystal growth, in growing GaN crystalline body 10 on GaN seed crystal 10s and in cooling grown GaN crystalline body 10, heat-insulating material 104a consisting of one component was arranged on the outer side of the main surface on the side of GaN seed crystal 10s, of GaN crystalline body 10 containing GaN seed crystal 10s and heat-insulating material 104b consisting of a plurality of components was arranged on the outer side of the outer circumference of GaN crystalline body 10 containing GaN seed crystal 10s, as heat-insulating material 104 as an assembly of a plurality of components. Heat-insulating materials 104a and 104b were formed of solid carbon covered with silicon carbide (SiC).

A portion of heat-insulating material 104a corresponding to intended notch portion 10n of GaN crystalline body 10 was longer in shortest distance from the outer edge (outer circumference) of heat-insulating material 104 than other portions. Specifically, the shortest distance between a portion of heat-insulating material 104a located directly under intended notch portion 10n of GaN crystalline body 10 and the outer edge (outer circumference) of heat-insulating material 104a was 5 mm and the shortest distance between a portion of heat-insulating material 104a other than the portion located directly under intended notch portion 10n of GaN crystalline body 10 and the outer edge (outer circumference) of heat-insulating material 104a was 3 mm. A component of heat-insulating material 104b located on the outer side of intended notch portion 10n of GaN crystalline body 10 had a large thickness (specifically, a cylindrical component had a diameter of 4 mm) and a component thereof located on the outer side of a portion other than intended notch portion 10n of GaN crystalline body 10 had a small thickness (specifically, a cylindrical body had a diameter of 2 mm). The average dislocation density and the average residual stress in obtained GaN crystal substrate 11 could thus be adjusted to be within prescribed ranges. GaN crystalline body 10 which had undergone crystal growth and cooling was taken out of crystal growth vessel 105.

2. Fabrication of GaN Crystal Substrate

GaN crystal substrate 11 was cut from taken GaN crystalline body 10. By grinding and polishing the outer edge (outer circumference) of cut GaN crystal substrate 11, notch portion 11n machined into a shape by cutting off a portion extending by 1.0 mm from the outer edge toward the center at an opening angle of 90 degrees in the direction of the M axis ([1-100]) when the direction of the central cut of the notch was viewed from the center of the substrate was provided in a part of the outer edge (outer circumference) of GaN crystal substrate 11. An amount of cooling water 202w injected from cooling water container 202u was increased only while notch portion 11n was provided. The average dislocation density and the average residual stress in the first notch region in obtained GaN crystal substrate 11 could thus be adjusted to be within prescribed ranges.

The average dislocation density, the average residual stress, and the crack defect ratio of obtained GaN crystal substrate 11 were evaluated as in Experimental Example 1. Table 25 summarizes a crack defect ratio in manufacturing of the substrate and Table 26 summarizes a crack defect ratio in growth of the epitaxial layer, in combinations of Examples where the average dislocation density in the first notch region was from $1.2\times10^3$ cm$^{-2}$ to $4.7\times10^7$ cm$^{-2}$ and Comparative Examples where the average dislocation density in the first notch region was $3.5\times10^2$ cm$^{-2}$ and $2.0\times10^8$ cm$^{-2}$ with Examples where the average residual stress in the first notch region was from −9 MPa to 10 MPa and Comparative Examples where the average residual stress in the first notch region was −28 MPa and 30 MPa in the present Experimental Example (Experimental Example 13).

TABLE 25

| Crack Defect Ratio (%) in Manufacturing of Substrate [Carrier Concentration: $1.0 \times 10^{18}$ cm$^{-3}$] | | Average Dislocation Density (cm$^{-2}$) | | | | | |
|---|---|---|---|---|---|---|---|
| [Diameter: 4 inches] [First Notch Region] | | $3.5 \times 10^2$ | $1.2 \times 10^3$ | $1.5 \times 10^4$ | $9.0 \times 10^6$ | $4.7 \times 10^7$ | $2.0 \times 10^8$ |
| Average Residual Stress (MPa) | −28 | 6.3 | 4.3 | 4.3 | 4.5 | 5.0 | 6.8 |
| | −9 | 4.5 | 3.3 | 3.1 | 3.1 | 3.5 | 4.4 |
| | −5 | 4.4 | 3.4 | 3.7 | 3.4 | 3.3 | 4.6 |
| | 3 | 4.8 | 3.0 | 3.5 | 3.3 | 3.7 | 4.5 |
| | 10 | 4.9 | 3.6 | 3.4 | 3.4 | 3.6 | 4.3 |
| | 30 | 6.5 | 4.5 | 4.8 | 4.6 | 4.9 | 7.0 |

TABLE 26

| Crack Defect Ratio (%) in Epitaxial Layer Growth [Carrier Concentration: $1.0 \times 10^{18}$ cm$^{-3}$] | | Average Dislocation Density (cm$^{-2}$) | | | | | |
|---|---|---|---|---|---|---|---|
| [Diameter: 4 inches] [First Notch Region] | | $3.5 \times 10^2$ | $1.2 \times 10^3$ | $1.5 \times 10^5$ | $9.0 \times 10^6$ | $4.7 \times 10^7$ | $2.0 \times 10^8$ |
| Average Residual Stress (MPa) | −28 | 5.0 | 4.0 | 3.8 | 3.6 | 4.2 | 5.5 |
| | −9 | 3.9 | 3.0 | 2.8 | 2.6 | 2.9 | 4.4 |
| | −5 | 3.8 | 2.9 | 2.7 | 2.9 | 2.6 | 4.3 |
| | 3 | 3.9 | 2.8 | 2.8 | 2.4 | 2.5 | 4.0 |
| | 10 | 4.3 | 2.8 | 2.6 | 2.5 | 2.8 | 3.9 |
| | 30 | 5.6 | 4.2 | 3.8 | 4.1 | 3.8 | 5.4 |

Experimental Example 14

The GaN crystal substrate was fabricated, the average dislocation density and the average residual stress in the first notch region were measured, and a crack defect ratio in polishing of the GaN crystal substrate and in growth of the GaN layer which was the epitaxial layer on the GaN crystal substrate after polishing of the GaN crystal substrate was calculated as in Experimental Example 13 except for setting a diameter to 6.0 inches (152.4 mm) and setting a carrier concentration to $1.5\times10^{18}$ cm$^{-3}$. Table 27 summarizes a crack defect ratio in manufacturing of the substrate and Table 28 summarizes a crack defect ratio in growth of the epitaxial layer, in combinations of Examples where the average dislocation density in the first notch region was from $1.1\times10^3$ cm$^{-2}$ to $4.9\times10^7$ cm$^{-2}$ and Comparative Examples where the average dislocation density in the first notch region was $4.3\times10^2$ cm$^{-2}$ and $1.4\times10^8$ cm$^{-2}$ with Examples where the average residual stress in the first notch region was from −10 MPa to 9 MPa and Comparative Examples where the average residual stress in the first notch region was −29 MPa and 25 MPa in the present Experimental Example (Experimental Example 14).

TABLE 27

| Crack Defect Ratio (%) in Manufacturing of Substrate [Carrier Concentration: $1.5 \times 10^{18}$ cm$^{-3}$] | | Average Dislocation Density (cm$^{-2}$) | | | | | |
|---|---|---|---|---|---|---|---|
| [Diameter: 6 inches] [First Notch Region] | | $4.3 \times 10^2$ | $1.1 \times 10^3$ | $4.0 \times 10^4$ | $1.2 \times 10^6$ | $4.9 \times 10^7$ | $1.4 \times 10^8$ |
| Average Residual Stress (MPa) | −29 | 7.0 | 5.0 | 5.5 | 5.3 | 5.0 | 8.0 |
| | −10 | 5.4 | 4.0 | 4.5 | 4.2 | 3.9 | 5.4 |
| | −5 | 5.9 | 4.1 | 3.9 | 4.5 | 4.0 | 5.8 |
| | 4 | 5.8 | 3.9 | 4.3 | 4.2 | 4.3 | 5.4 |
| | 9 | 5.9 | 4.2 | 4.0 | 4.8 | 4.1 | 5.0 |
| | 25 | 7.7 | 5.5 | 6.0 | 5.8 | 5.1 | 7.0 |

TABLE 28

Crack Defect Ratio (%) in Epitaxial Layer Growth
[Carrier Concentration: $1.5 \times 10^{18}$ cm$^{-3}$]

| | | Average Dislocation Density (cm$^{-2}$) | | | | | |
|---|---|---|---|---|---|---|---|
| [Diameter: 6 inches] [First Notch Region] | | $4.3 \times 10^2$ | $1.1 \times 10^3$ | $4.0 \times 10^4$ | $1.2 \times 10^6$ | $4.9 \times 10^7$ | $1.4 \times 10^8$ |
| Average Residual Stress (MPa) | −29 | 6.0 | 5.0 | 5.2 | 5.6 | 5.4 | 6.7 |
| | −10 | 5.2 | 3.6 | 4.0 | 3.7 | 4.0 | 5.6 |
| | −5 | 5.8 | 3.8 | 3.8 | 3.8 | 3.7 | 5.0 |
| | 4 | 5.4 | 3.6 | 3.0 | 3.7 | 3.8 | 5.4 |
| | 9 | 5.4 | 3.8 | 3.5 | 3.6 | 3.7 | 5.8 |
| | 25 | 6.5 | 5.8 | 5.6 | 5.7 | 5.5 | 6.5 |

As shown in Experimental Examples 1 to 14, it can be seen that the crack defect ratio in manufacturing of the substrate and in growth of the epitaxial layer on the substrate is low in the GaN crystal substrate having a diameter not smaller than 50 mm and not greater than 155 mm and a thickness not smaller than 300 μm and not greater than 800 μm and including any of the flat portion and the notch portion in a part of the outer edge thereof when the GaN crystal substrate contains any of oxygen (O) atoms, silicon (Si) atoms, and carriers at a concentration not lower than $2 \times 10^{17}$ cm$^{-3}$ and not higher than $4 \times 10^{18}$ cm$^{-3}$ and has the average dislocation density not lower than 1000 cm$^{-2}$ and not higher than $5 \times 10^7$ cm$^{-2}$ or the average residual stress not lower than −10 MPa and not higher than 10 MPa in any of the first flat region and the first notch region.

Furthermore, it can be seen that the crack defect ratio in manufacturing of the substrate and in growth of the epitaxial layer on the substrate is lower in the GaN crystal substrate above when the GaN crystal substrate contains any of oxygen (O) atoms, silicon (Si) atoms, and carriers at a concentration not lower than $2 \times 10^{17}$ cm$^{-3}$ and not higher than $4 \times 10^{18}$ cm$^{-3}$ and has the average dislocation density not lower than 1000 cm$^{-2}$ and not higher than $5 \times 10^7$ cm$^{-2}$ and the average residual stress not lower than −10 MPa and not higher than 10 MPa in any of the first flat region and the first notch region.

Experimental Example 15

The GaN crystal substrate was fabricated, the average dislocation density and the average residual stress in the second flat region (a region extending over a width from the flat portion to a position at a distance of 1 mm in the direction perpendicular to the straight line indicating the flat portion in the main surface) were measured, and a crack defect ratio in polishing of the GaN crystal substrate and in growth of the GaN layer which was the epitaxial layer on the GaN crystal substrate after polishing of the GaN crystal substrate was calculated as in Experimental Example 11 except for setting the shortest distance between a portion of heat-insulating material 104 located directly under intended flat portion 10f of GaN crystalline body 10 and the outer edge (outer circumference) of heat-insulating material 104 to the shortest distance twice as long as that in Experimental Example 11. Table 29 summarizes a crack defect ratio in manufacturing of the substrate and Table 30 summarizes a crack defect ratio in growth of the epitaxial layer, in combinations of Examples where the average dislocation density in the second flat region was from $1.2 \times 10^3$ cm$^{-2}$ to $5.0 \times 10^7$ cm$^{-2}$ and Comparative Examples where the average dislocation density in the second flat region was $5.1 \times 10^2$ cm$^{-2}$ and $1.7 \times 10^8$ cm$^{-2}$ with Examples where the average residual stress in the second flat region was from −10 MPa to 9 MPa and Comparative Examples where the average residual stress in the second flat region was −22 MPa and 24 MPa in the present Experimental Example (Experimental Example 15).

TABLE 29

Crack Defect Ratio (%) in Manufacturing of Substrate
[Carrier Concentration: $1.5 \times 10^{18}$ cm$^{-3}$]

| | | Average Dislocation Density (cm$^{-2}$) | | | | | |
|---|---|---|---|---|---|---|---|
| [Diameter: 2 inches] [Second Flat Region] | | $5.1 \times 10^2$ | $1.2 \times 10^3$ | $3.0 \times 10^4$ | $1.2 \times 10^6$ | $5.0 \times 10^7$ | $1.7 \times 10^8$ |
| Average Residual Stress (MPa) | −22 | 1.7 | 1.2 | 1.0 | 1.2 | 1.3 | 1.9 |
| | −10 | 1.4 | 0.5 | 0.8 | 0.8 | 0.6 | 1.3 |
| | −4 | 1.4 | 0.6 | 0.7 | 0.7 | 0.7 | 1.3 |
| | 4 | 1.3 | 0.6 | 0.8 | 0.7 | 0.8 | 1.3 |
| | 9 | 1.6 | 0.7 | 0.8 | 0.7 | 0.7 | 1.5 |
| | 24 | 2.1 | 1.2 | 1.3 | 1.2 | 1.2 | 1.8 |

TABLE 30

Crack Defect Ratio (%) in Epitaxial Layer Growth
[Carrier Concentration: $1.5 \times 10^{18}$ cm$^{-3}$]

| | | Average Dislocation Density (cm$^{-2}$) | | | | | |
|---|---|---|---|---|---|---|---|
| [Diameter: 2 inches] [Second Flat Region] | | $5.1 \times 10^2$ | $1.2 \times 10^3$ | $3.0 \times 10^4$ | $1.2 \times 10^6$ | $5.0 \times 10^7$ | $1.7 \times 10^8$ |
| Average Residual Stress (MPa) | −22 | 1.9 | 0.8 | 0.8 | 0.7 | 0.9 | 1.4 |
| | −10 | 0.7 | 0.1 | 0.2 | 0.2 | 0.3 | 0.8 |
| | −4 | 0.8 | 0.2 | 0.3 | 0.3 | 0.3 | 0.8 |
| | 4 | 0.8 | 0.1 | 0.1 | 0.1 | 0.3 | 0.8 |
| | 9 | 0.7 | 0.1 | 0.2 | 0.1 | 0.2 | 0.7 |
| | 24 | 1.6 | 0.8 | 0.8 | 0.8 | 0.8 | 1.6 |

Experimental Example 16

Referring to FIGS. 6A and 6B, the GaN crystal substrate was fabricated, the average dislocation density and the average residual stress in the second notch region (a region extending over a width from the notch portion to a position at a distance of 1 mm in the direction perpendicular to the curve indicating the notch portion in the main surface) were measured, and a crack defect ratio in polishing of the GaN crystal substrate and in growth of the GaN layer which was the epitaxial layer on the GaN crystal substrate after polishing of the GaN crystal substrate was calculated as in Experimental Example 13 except for setting the shortest distance between a portion of heat-insulating material 104a located directly under intended notch portion 10n of GaN crystalline body 10 and the outer edge (outer circumference) of heat-insulating material 104a to the shortest distance twice as long as that in Experimental Example 13 and setting a thickness (specifically, a diameter of a cylindrical component) of a component of heat-insulating material 104b located on the outer side of intended notch portion 10n of GaN crystalline body 10 to a thickness twice as large as the thickness in Experimental Example 13. Table 31 summarizes a crack defect ratio in manufacturing of the substrate and Table 32 summarizes a crack defect ratio in growth of the epitaxial layer, in combinations of Examples where the average dislocation density in the second notch region was from $1.2 \times 10^3$ cm$^{-2}$ to $4.7 \times 10^7$ cm$^{-2}$ and Comparative Examples where the average dislocation density in the second notch region was $3.5 \times 10^2$ cm$^{-2}$ and $2.0 \times 10^8$ cm$^{-2}$ with Examples where the average residual stress in the second notch region was from −9 MPa to 10 MPa and Comparative Examples where the average residual stress in the second notch region was −28 MPa and 30 MPa in the present Experimental Example (Experimental Example 16).

TABLE 31

Crack Defect Ratio (%) in Manufacturing of Substrate [Carrier Concentration: $1.0 \times 10^{18}$ cm$^{-3}$]

| [Diameter: 4 inches] [Second Notch Region] | | $3.5 \times 10^2$ | $1.2 \times 10^3$ | $1.5 \times 10^5$ | $9.0 \times 10^6$ | $4.7 \times 10^7$ | $2.0 \times 10^8$ |
|---|---|---|---|---|---|---|---|
| Average Residual Stress (MPa) | −28 | 3.0 | 2.3 | 2.2 | 2.3 | 2.5 | 3.4 |
| | −9 | 4.3 | 1.7 | 1.6 | 1.6 | 1.8 | 2.2 |
| | −5 | 2.5 | 1.8 | 1.9 | 1.7 | 1.7 | 2.3 |
| | 3 | 2.5 | 1.5 | 1.7 | 1.6 | 1.8 | 2.3 |
| | 10 | 2.5 | 1.8 | 1.7 | 1.7 | 1.8 | 2.2 |
| | 30 | 3.3 | 2.3 | 2.4 | 2.3 | 2.5 | 4.0 |

TABLE 32

Crack Defect Ratio (%) in Epitaxial Layer Growth [Carrier Concentration: $1.0 \times 10^{18}$ cm$^{-3}$]

| [Diameter: 4 inches] [Second Notch Region] | | $3.5 \times 10^2$ | $1.2 \times 10^3$ | $1.5 \times 10^5$ | $9.0 \times 10^6$ | $4.7 \times 10^7$ | $2.0 \times 10^8$ |
|---|---|---|---|---|---|---|---|
| Average Residual Stress (MPa) | −28 | 3.0 | 2.0 | 1.9 | 1.8 | 2.1 | 2.7 |
| | −9 | 2.0 | 1.5 | 1.4 | 1.3 | 1.5 | 2.3 |
| | −5 | 2.9 | 1.5 | 1.4 | 1.5 | 1.3 | 2.0 |
| | 3 | 2.0 | 1.4 | 1.4 | 1.2 | 1.3 | 2.1 |
| | 10 | 2.1 | 1.5 | 1.2 | 1.3 | 1.4 | 2.2 |
| | 30 | 3.2 | 2.1 | 1.9 | 2.1 | 1.9 | 3.0 |

As shown in Experimental Examples 15 and 16, it can be seen that the crack defect ratio in manufacturing of the substrate and in growth of the epitaxial layer on the substrate is low in the GaN crystal substrate having a diameter not smaller than 50 mm and not greater than 155 mm and a thickness not smaller than 300 µm and not greater than 800 µm and including any of the flat portion and the notch portion in a part of the outer edge thereof when the GaN crystal substrate contains any of oxygen (O) atoms, silicon (Si) atoms, and carriers at a concentration not lower than $2\times10^{17}$ cm$^{-3}$ and not higher than $4\times10^{18}$ cm$^{-3}$ and has the average dislocation density not lower than 1000 cm$^{-2}$ and not higher than $5\times10^7$ cm$^{-2}$ or the average residual stress not lower than −10 MPa and not higher than 10 MPa in any of the second flat region and the second notch region.

Furthermore, it can be seen that the crack defect ratio in manufacturing of the substrate and in growth of the epitaxial layer on the substrate is lower in the GaN crystal substrate above when the GaN crystal substrate contains any of oxygen (O) atoms, silicon (Si) atoms, and carriers at a concentration not lower than $2\times10^{17}$ cm$^{-3}$ and not higher than $4\times10^{18}$ cm$^{-3}$ and has the average dislocation density not lower than 1000 cm$^{-2}$ and not higher than $5\times10^7$ cm$^{-2}$ and the average residual stress not lower than −10 MPa and not higher than 10 MPa in any of the second flat region and the second notch region.

It should be understood that the embodiments and Examples disclosed herein are illustrative and non-restrictive in every respect. The scope of the present invention is defined by the terms of the claims rather than the embodiments and Examples above and is intended to include any modifications within the scope and meaning equivalent to the terms of the claims.

REFERENCE SIGNS LIST

10 GaN crystalline body; 10$f$ intended flat portion; 10$n$ intended notch portion; 10$s$ GaN seed crystal; 11 GaN crystal substrate; 11$f$ flat portion; 11$fr$, 11$frc$ first flat region, second flat region; 11$n$ notch portion; 11$nr$, 11$nrc$ first notch region, second notch region; 100 crystal growth apparatus; 102 base; 103 heater; 104, 104$a$, 104$b$ heat-insulating material; 105 crystal growth vessel; 106 Ga source material supply pipe; 107 N source material supply pipe; 201 grindstone; 202$u$ cooling water container; 202$w$ cooling water; LR length; WR width; IL light; RL Raman scattered light

The invention claimed is:

1. A gallium nitride crystal substrate including a main surface having a diameter not smaller than 50 mm and not greater than 155 mm and a thickness not smaller than 300 µm and not greater than 800 µm,
   a part of an outer edge of the gallium nitride crystal substrate including any of a flat portion and a notch portion,
   the gallium nitride crystal substrate containing any of oxygen atoms, silicon atoms, and carriers at a concentration not lower than $2\times10^{17}$ cm$^{-3}$ and not higher than $4\times10^{18}$ cm$^{-3}$,
   the gallium nitride crystal substrate having an average dislocation density not lower than 1000 cm$^{-2}$ and not higher than $5\times10^7$ cm$^{-2}$ in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface.

2. A gallium nitride crystal substrate including a main surface having a diameter not smaller than 50 mm and not greater than 155 mm and a thickness not smaller than 300 µm and not greater than 800 µm,
   a part of an outer edge of the gallium nitride crystal substrate including any of a flat portion and a notch portion,
   the gallium nitride crystal substrate containing any of oxygen atoms, silicon atoms, and carriers at a concentration not lower than $2\times10^{17}$ cm$^{-3}$ and not higher than $4\times10^{18}$ cm$^{-3}$, and
   the gallium nitride crystal substrate having average residual stress not lower than −10 MPa and not higher than 10 MPa in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface.

3. The gallium nitride crystal substrate according to claim 1, the gallium nitride crystal substrate having average residual stress not lower than −10 MPa and not higher than 10 MPa in any of the first flat region and the first notch region.

4. A gallium nitride crystal substrate including a main surface having a diameter not smaller than 50 mm and not greater than 155 mm and a thickness not smaller than 300 μm and not greater than 800 μm,
- a part of an outer edge of the gallium nitride crystal substrate including any of a flat portion and a notch portion,
- the gallium nitride crystal substrate containing any of oxygen atoms, silicon atoms, and carriers at a concentration not lower than $2 \times 10^{17}$ cm$^{-3}$ and not higher than $4 \times 10^{18}$ cm$^{-3}$,
- the gallium nitride crystal substrate having an average dislocation density not lower than 1000 cm$^{-2}$ and not higher than $5 \times 10^7$ cm$^{-2}$ in any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface.

5. A gallium nitride crystal substrate including a main surface having a diameter not smaller than 50 mm and not greater than 155 mm and a thickness not smaller than 300 μm and not greater than 800 μm,
- a part of an outer edge of the gallium nitride crystal substrate including any of a flat portion and a notch portion,
- the gallium nitride crystal substrate containing any of oxygen atoms, silicon atoms, and carriers at a concentration not lower than $2 \times 10^{17}$ cm$^{-3}$ and not higher than $4 \times 10^{18}$ cm$^{-3}$, and
- the gallium nitride crystal substrate having average residual stress not lower than −10 MPa and not higher than 10 MPa in any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface.

6. The gallium nitride crystal substrate according to claim 4, the gallium nitride crystal substrate having average residual stress not lower than −10 MPa and not higher than 10 MPa in any of the second flat region and the second notch region.

* * * * *